US009837611B2

(12) United States Patent
Echegoyen et al.

(10) Patent No.: US 9,837,611 B2
(45) Date of Patent: Dec. 5, 2017

(54) PHOTO-SWITCHABLE FULLERENE-BASED MATERIALS AS INTERFACIAL LAYERS IN ORGANIC PHOTOVOLTAICS

(71) Applicant: Board of Regents, The University of Texas System, Austin, TX (US)

(72) Inventors: Luis Echegoyen, El Paso, TX (US); Michael D. Irwin, El Paso, TX (US); Danisha M. Rivera-Nazario, El Paso, TX (US)

(73) Assignee: BOARD OF REGENTS, THE UNIVERSITY OF TEXAS SYSTEM, Austin, TX (US)

(*) Notice: Subject to any disclaimer, the term of this patent is extended or adjusted under 35 U.S.C. 154(b) by 971 days.

(21) Appl. No.: 13/624,398

(22) Filed: Sep. 21, 2012

(65) Prior Publication Data
US 2013/0074920 A1    Mar. 28, 2013

Related U.S. Application Data

(60) Provisional application No. 61/538,494, filed on Sep. 23, 2011.

(51) Int. Cl.
*H01L 51/00* (2006.01)
*H01L 31/18* (2006.01)
(Continued)

(52) U.S. Cl.
CPC .......... *H01L 51/0035* (2013.01); *B82Y 10/00* (2013.01); *B82Y 30/00* (2013.01);
(Continued)

(58) Field of Classification Search
CPC ............... H01L 51/0035; H01L 51/004; H01L 51/0046; H01L 51/0047; H01L 51/0077;
(Continued)

(56) References Cited

U.S. PATENT DOCUMENTS

| 7,799,990 B2 | 9/2010 | Marks et al. |
| 2008/0319207 A1* | 12/2008 | Laird ..................... B82Y 10/00 549/29 |
| 2009/0044855 A1 | 2/2009 | Irwin et al. |

FOREIGN PATENT DOCUMENTS

WO    2010059240 A1    5/2010

OTHER PUBLICATIONS

Kira, Aiko, Tomokazu Umeyama, Yoshihiro Matano, Kaname Yoshida, Seiji Isoda, Jong Kang Park, Dongho Kim, and Hiroshi Imahori. "Supramolecular Donor-Acceptor Heterojunctions by Vectorial Stepwise Assembly of Porphyrins and Coordination-Bonded Fullerene Arrays for Photocurrent Generation." J. Am. Chem. Soc. Journal of the American Chemical Society 13.*

(Continued)

*Primary Examiner* — Keith Hendricks
*Assistant Examiner* — Kourtney S Carlson
(74) *Attorney, Agent, or Firm* — Norton Rose Fulbright US LLP

(57) ABSTRACT

Design and use of photo-switching, fullerene-based dyads of the design x-D-y-A or D-y-A-x as interfacial layers (IFL) for organic photovoltaic (OPV) devices are described herein. The fullerene-based dyads and triads of the present invention contain electron-donating substituents such as porphyrins or phthalocyanines that exhibit charge separation states with long lifetimes upon irradiation, resulting in rejection of electrons reaching the electrode and concurrently promoting the conduction of holes. This phenomenon has a strong rectifying effect on the whole device, not just the interfaces, resulting in improved charge extraction from the interior of the photo-active layer. The invention further describes anchoring an IFL to the ITO surface as a monolayer, bilayer, or greater multilayers. One OPV design embodiment of the present invention embodiment involves the formation of (Continued)

covalent bonds via silane groups (—SiR$_3$) as the anchor (x), to form siloxane bonds.

8 Claims, 7 Drawing Sheets

(51) Int. Cl.
  *H01L 31/0224* (2006.01)
  *B82Y 30/00* (2011.01)
  *B82Y 10/00* (2011.01)
  *B82Y 40/00* (2011.01)
  *H01L 51/42* (2006.01)
  *B82Y 20/00* (2011.01)

(52) U.S. Cl.
  CPC ...... *H01L 31/022425* (2013.01); *H01L 31/18* (2013.01); *H01L 51/004* (2013.01); *H01L 51/0046* (2013.01); *H01L 51/0047* (2013.01); *H01L 51/0077* (2013.01); *B82Y 20/00* (2013.01); *B82Y 40/00* (2013.01); *H01L 51/0075* (2013.01); *H01L 51/0078* (2013.01); *H01L 51/42* (2013.01); *H01L 51/4206* (2013.01); *H01L 2251/308* (2013.01); *Y02E 10/549* (2013.01); *Y10S 977/948* (2013.01)

(58) Field of Classification Search
  CPC . H01L 51/0075; H01L 51/0078; H01L 51/42; H01L 51/4206; H01L 2251/308; H01L 31/022425; H01L 31/18; B82Y 10/30; B82Y 30/00; B82Y 20/00; B82Y 40/00
  USPC .............................. 136/242–265; 438/82, 47
  See application file for complete search history.

(56) References Cited

OTHER PUBLICATIONS

Walter, Michael G., Alexander B. Rudine, and Carl C. Wamser. "Porphyrins and Phthalocyanines in Solar Photovoltaic Cells." J. Porphyrins Phthalocyanines Journal of Porphyrins and Phthalocyanines 14.09 (2010): 759-92.*
Ahlswede, E., et al., "Comparative study of the influence of LiF, NaF, and KF on the performance of polymer bulk heterojunction solar cells" Appl. Phys. Lett., Apr. 16, 2007, 90, 163504/1.
Allemand, P. M., et al., "Two different fullerenes have the same cyclic voltammetry," J. Am. Chem. Soc., 1991, 113, 1050.
Araki, Y., et al., "Factors controlling lifetimes of photoinduced charge-separated states 20 of fullerene-donor molecular systems," Journal of Photochemistry and Photobiology C:Photochemistry Reviews, Jun. 3, 2008, 9, 93.
Araki, Y., et al., "Self-Assembled Supramolecular Ferrocene—Fullerene Dyads and Triad:Formation and Photoinduced Electron Transfer," The Journal of Physical Chemistry C Jan. 18, 2008, 112, 2222.
Beaumont, N., et al. "Increased efficiency in small molecule organic photovoltaic cells through electrode modification with self-assembled monolayers," Energy Environ. Sci., Mar. 2011, 4, 1708.
Betancur, R., et al., "Sputtered NiO as electron blocking layer in P3HT:PCBM solar cells fabricated in ambient air," Sol. Energy Mater. Sol. Cells, Nov. 3, 2010, 95, 735.
Bourgeois, J.-P., et al., "Synthesis, and Optical and Electrochemical Properties of Cyclophane-Type Molecular Dyads Containing a Porphyrin in Close, Tangential Orientation Relative to the Surface of trans-1 Functionalized C60," Helv. Chim. Acta, 1998, 81, 1835.
Brumbach, M., et al., "Surface Composition and Electrical and Electrochemical Properties of Freshly Deposited and Acid-Etched Indium Tin Oxide Electrodes" Langmuir, Sep. 20, 2007, 23, 11089.
Burk, R. M., et al., "A mild procedure for etherification of alcohols with primary alkyl halides in the presence of silver triflate" Tetrahedron Lett. 1994, 35, 8111.
Delgado, J. L., et al., "Organic photovoltaics: a chemical approach" Chemical Communications, May 25, 2010, 46, 4853.
D'Souza, F., et al., "Probing the Donor-Acceptor Proximity on the Physicochemical Properties of Porphyrin-Fullerene Dyads: "Tail-On" and "Tail-Off" Binding Approach" J. Am. Chem. Soc., May 11, 2001, 123, 5277.
Fazio, M. A., et al., "Synthesis, Conformational Interconversion, and Photophysics of Tethered Porphyrin-Fullerene Dyads with Parachute Topology" Chemistry—A European Journal, 2009, 15, 7698.
Fragoso, A., et al., "A supramolecular approach to the selective detection of dopamine in the presence of ascorbate" Chemical Communications, Aug. 23, 2004, 2230.
Girtan, M.. et al., "Role of ITO and PEDOT:PSS in stability/degradation of polymer:fullerene bulk heterojunctions solar cells" Sol. Energy Mater. Sol. Cells, Nov. 27, 2009, 94, 446.
González-Rodríguez, D., et al., "Screening Electronic Communication through ortho-, meta- and para-Substituted Linkers Separating Subphthalocyanines and C60" Chemistry—A European Journal, Jul. 15, 2008, 14, 7670.
Guldi, D. M., et al., "Parallel (Face-to-Face) Versus Perpendicular (Edge-to-Face) Alignment of Electron Donors and Acceptors in Fullerene Porphyrin Dyads: The Importance of Orientation in Electron Transfer" J. Am. Chem. Soc., Aug. 23, 2001, 123, 9166.
Guldi, D. M., et al., "Modulating Charge-Transfer Interactions in Topologically Different Porphyrin-C60 Dyads" 10 Chemistry—A European Journal 2003, 9, 4968.
Guldi, D. M., et al., "Zwitterionic Acceptor Moieties: Small Reorganization Energy and Unique Stabilization of Charge Transfer Products" The Journal of Physical Chemistry B, Mar. 19, 2003, 107, 7293.
Hains, A. W., et al., "Designed Bithiophene-Based Interfacial Layer for High-Efficiency Bulk-Heterojunction Organic Photovoltaic Cells: Importance of Interfacial Energy Level Matching" ACS Appl. Mater. Interfaces, Dec. 7, 2009, 2, 175.
Handa, S., et al., "Solid Film versus Solution-Phase Charge-Recombination Dynamics of exTTF-Bridge-C60 Dyads" Chemistry—A European Journal, Oct. 27, 2005, 11, 7440.
Haque, A.-M. J., et al., "Aldehyde-Functionalized Benzenediazonium Cation for Multiprobe Immobilization on Microelectrode Array Surfaces" Langmuir, Jan. 6, 2011, 27, 882.
Hoang, V. T., et al., "Synthesis and formation of monolayer selfassembly of thiol appended fullerenes and fullerene-ferrocene dyads on gold electrode" Electrochem. Commun., 2002, 4, 50.
Imahori, H., et al., "The small reorganization energy of C60 in electron transfer" Chem. Phys. Lett., Dec. 13, 1996, 263, 545.
Imahori, H., et al., "Linkage and Solvent Dependence of Photoinduced Electron Transfer in Zincporphyrin-C60 Dyads" J. Am. Chem. Soc., Aug. 1996, 118, 11771.
Imahori, H., et al., "Modulating Charge Separation and Charge Recombination Dynamics in Porphyrin-Fullerene Linked Dyads and Triads: Marcus-Normal versus Inverted Region" J. Am. 25 Chem. Soc., Feb. 23, 2001, 123, 2607.
Johnstone, R. A. W., et al., "A rapid, simple, and mild procedure for alkylation of phenols, alcohols, amides and acids" Tetrahedron 1979, 35, 2169.
Jorgensen, M., et al., "Stability/degradation of polymer solar cells," Sol. Energy Mater. Sol. Cells, Mar. 10, 2008, 92, 686.
Ka, J.-W.; Lee, C.-H. "Optimizing the synthesis of 5,10-disubstituted tripyrromethanes" Tetrahedron Lett., Apr. 21, 2000, 41, 4609.
Kawauchi, H., et al., "Photoinduced Charge-Separation and Charge-Recombination Processes of Fullerene[60] Dyads Covalently Connected with Phenothiazine and Its Trimer" The Journal of Physical Chemistry A, Jun. 11, 2008, 112, 5878.
Kemerink, M., et al., "Three-Dimensional Inhomogeneities in PEDOT:PSS Films" J. Phys. Chem. B, Nov. 13, 2004, 108, 18820.

(56) References Cited

OTHER PUBLICATIONS

Bandyopadhyay, K.; et al. "Self-assembled monolayers of bis-thioctic ester derivatives of oligoethyleneglycols: remarkable selectivity for K+/Na+ recognition" Chemical Communications, Jan. 2000, 141.

Bandyopadhyay, K.; et al. "Ion Recognition at the Interface of Self-Assembled Monolayers (SAMs) of Bis-Thioctic Ester Derivatives of Oligo(ethyleneglycols)," Chemistry—A European Journal, 2000, 6:23, 4385.

Bandyopadhyay, K., et al., "Selective K+ Recognition at the Interface during Self-Assembly of a Bis-Podand Thiol on a Gold Surface," Langmuir, Jan. 2000, 16, 2706-2714.

Campidelli, S., et al., "Liquid-crystalline fullerene-ferrocene dyads," J. Mater. Chem., Mar. 2004, 14, 1266-1272.

Cho, Y.-J., et al., "Unusually High Performance Photovoltaic Cell Based on a [60]Fullerene Metal Cluster-Porphyrin Dyad SAM on an ITO Electrode," Journal of the American Chemical Society, Feb. 2005, 127, 2380-2381.

Curiel, D., et al., "Photoinduced electron transfer in a [small beta],[small beta][prime or minute]-pyrrolic fused ferrocene-(zinc porphyrin)-fullerene," Physical Chemistry Chemical Physics, Aug. 2007, 9, 5260-5266.

De La Escpsira, A., et al., "Stabilization of Charge-Separated States in Phthalocyanine-Fullerene Ensembles through Supramolecular Donor-Acceptor Interactions," J. Am. Chem. Soc., Mar. 2006, 128, 4112.

Gonzalez-Rodriguez, D., et al., "Photoinduced Charge-Transfer States in Subphthalocyanine-Ferrocene Dyads," J. Am. Chem. Soc., Aug. 2006, 128, 10680-10681.

Guldi, D., et al., "Metallophthalocyanines: Versatile Electron-Donating Building Blocks for Fullerene Dyads," The Journal of Physical Chemistry B, Nov. 2004, 108, 18485-18494.

Hau, S. K. et al., "High performance ambient processed inverted polymer solar cells through interfacial modification with a fullerene self-assembled monolayer," Appl. Phys. Lett., Dec. 2008, 93, 233304/1.

Heidel, T. D., et al., "Reducing recombination losses in planar organic photovoltaic cells using multiple step charge separation" Journal of Applied Physics, May 2011, 109, 104502.

Hummelen, J. C., et al., "Preparation and Characterization of Fulleroid and Methanofullerene Derivatives," J. Org. Chem., Oct. 1995, vol. 60:3, 532-538.

Imahori, H., "Creation of Fullerene-Based Artificial Photosynthetic Systems," Bull. Chem. Soc. Jpn., Apr. 2007, 80:4, 621-636.

Imahori, H., et al., "Porphyrin- and Fullerene-Based Molecular Photovoltaic Devices," Adv. Funct. Mater., Jun. 2004, 14:6, 525-536.

Irwin, M. D., et al., "p-Type semiconducting nickel oxide as an efficiency-enhancing anode interfacial layer in polymer bulk-heterojunction solar cells," Proc. Natl. Acad. Sci., Feb. 2008, 105:8, 2783-2787.

Irwin, M. D., et al., "Consequences of Anode Interfacial Layer Deletion. HCl-Treated ITO in P3HT:PCBM-Based Bulk-Heterojunction Organic Photovoltaic Devices," American Chemical Society, Nov. 2009, 26(4), 2584-2591.

Irwin, M. D., et al., "Structural and Electrical Functionality of NiO Interfacial Films in Bulk Heterojunction Organic Solar Cells," Chemistry of Materials, Apr. 2011, 23, 2218-2226.

Jousselme, B., et al., "Electrochemical Synthesis of C60-Derivatized Poly(thiophene)s from Tailored Precursors," Macromolecules, Apr. 2003, 36, 3020-3025.

Kim, J. S., et al., "Control of the electrode work function and active layer morphology via surface modification of indium tin oxide for high efficiency organic photovoltaics," Appl. Phys. Lett., Sep. 2007, 91, 112111/1.

Kramer, P., et al., "Polymerization of Para-Xylylene Derivatives (Parylene Polymerization). I. Deposition Kinetics for Parylene N and Parylene C," Journal of Polymer Science: Polymer Chemistry Edition, 1984, vol. 22, 475-491.

Lee, J. H., et al., "Enhanced diode characteristics of organic solar cells using titanium suboxide electron transport layer," Applied Physics Letters, Apr. 2010, 96, 163303/1.

Leever, B. J., et al., "Spatially resolved photocurrent mapping of operating organic photovoltaic devices using atomic force photovoltaic microscopy," Appl. Phys. Lett., Jan. 2008, 92, 013302/1.

Li, G., et al., "Investigation of annealing effects and film thickness dependence of polymer solar cells based on poly(3-hexylthiophene)," J. Appl. Phys., Aug. 2005, 98, 043704/1.

Li, G. et al., "High-efficiency solution processable polymer photovoltaic cells by self-organization of polymer blends," Nature Materials, Nov. 2005, 4:864-868.

Li, N., et al. "Open-circuit voltage enhancement due to reduced dark current in small molecule photovoltaic cells," Applied Physics Letters, Jan. 2009, 94, 023307/1.

Liu, S.-G., et al., "Dithia-Crown-Annelated Tetrathiafulvalene Disulfides: Synthesis, Electrochemistry, Self-Assembled Films, and Metal Ion Recognition," The Journal of Organic Chemistry, Jan. 2000, 65, 3292-3298.

Moliton, A, et al., "How to Model the Behavior of Organic Photovoltaic Cells", Polymer International, Jan. 2006, 55, 583-600.

O'Regan, B., et al. "A low-cost, high-efficiency solar cell based on dye-sensitized colloidal TiO2 films," Nature, Oct. 1991, 353, 737-740.

Pinzon, J. R., et al., "Photoinduced Charge Transfer and Electrochemical Properties of Triphenylamine Ih-Sc3N@C80 Donor-Acceptor Conjugates," Journal of the American Chemical Society, Jun. 2009, 131(22), 7727-7734.

Pivrikas, A., et al., "A Review of Charge Transport and Recombination in Polymer/Fullerene Organic Solar Cells," Progress in Photovoltaics Research and Applications, Jul. 2007, 15, 677-696.

Seo, J. H., et al., "Improved High-Efficiency Organic Solar Cells via Incorporation of a Conjugated Polyelectrolyte Interlayer," Journal of the American Chemical Society, May 2011, 133, 8416-8419.

Kesti, T., et al., "C70 vs. C60 in zinc porphyrin-fullerene dyads: prolonged charge separation and ultrafast energy transfer from the second excited singlet state of porphyrin" Photochem. Photobiol. Sci., Feb. 4, 2003, 2, 251.

Kim, J. Y., et al., "Efficient Tandem Polymer Solar Cells Fabricated by All-Solution Processing" Science (Washington, DC, U. S.), Jul. 13, 2007, 317, 222.

Kim, J. Y., et al. "New architecture for high-efficiency polymer photovoltaic cells using solution-based titanium oxide as an optical spacer" Adv. Mater. (Weinheim, Ger.) 2006, 18, 572.

Li, C. N., et al., "Improved performance of OLEDs with ITO surface treatments" Thin Solid Films, 2005, 477, 57.

Li, J., et al., "Air-Stable, Cross-Linkable, Hole-Injecting/Transporting Interlayers for Improved Charge Injection in Organic Light-Emitting Diodes" Chem. Mater. 2008, 20, 4873.

Li, J., et al., "Characterization of Transparent Conducting Oxide Surfaces Using Self-Assembled Electroactive Monolayers", Langmuir, May 6, 2008, 24, 5755.

Liang, Y., et al., "A New Class of Semiconducting Polymers for Bulk Heterojunction Solar Cells with Exceptionally High Performance" Acc. Chem. Res., Sep. 2010, 43, 1227.

Liddell, P. A., et al., "Photonic Switching of Photoinduced Electron Transfer in a Dihydropyrene-Porphyrin-Fullerene Molecular Triad" J. Am. Chem. Soc., Mar. 26, 2004,126, 4803.

Maggini, M., et al., "Addition of azomethine ylides to C60: synthesis, characterization, and functionalization of fullerene pyrrolidines" J. Am. Chem. Soc., Jun. 1993, 115, 9798.

Matsuo, Y., et al., "Molecular Photoelectric Switch Using a Mixed SAM of Organic [60]Fullerene and [70]Fullerene Doped with a Single Iron Atom" Journal of the American Chemical Society, May 23, 2011, 133, 9932-9937.

Nonnenmacher, M., et al., "Kelvin probe force microscopy" Appl. Phys. Lett., Jun. 24, 1991, 58, 2921.

Ohkubo, K., et al., "Fullerene acting as an electron donor in a donor-acceptor dyad to attain the long lived charge-separated state by complexation with scandium ion," Chemical Communications, Nov. 10, 2006, 589.

(56) References Cited

OTHER PUBLICATIONS

Pingree, L. S. C., et al., "The changing face of PEDOT:PSS films: substrate, bias, and processing effects on vertical charge transport" J. Phys. Chem. C, Apr. 8, 2008,112, 7922.

Pingree, L. S. C., et al., "Electrical scanning probe microscopy on active organic electronic devices" Adv. Mater. (Weinheim, Ger.) 2009, 21, 19.

Pinzón, J. R., et al., "Sc3N@C80-Ferrocene Electron-Donor/Acceptor Conjugates as Promising Materials for Photovoltaic Applications," Angewandte Chemie International Edition, Apr. 22, 2008, 47, 4173.

Poddutoori, P. K., et al., "Photoinduced Charge Separation in a Ferrocene-Aluminum(III) Porphyrin-Fullerene Supramolecular Triad†," The Journal of Physical Chemistry B, Apr. 5, 2010, 114, 14348.

Reid, O. G., et al., "Imaging Local Trap Formation in Conjugated Polymer Solar Cells: A Comparison of Time-Resolved Electrostatic Force Microscopy and Scanning Kelvin Probe Imaging" J. Phys. Chem. C, Oct. 14, 2010, 114, 20672.

Saam, J. C.; Speier, J. L. "The Addition of Silicon Hydrides to Olefinic Double Bonds. Part III. The Addition to Non-terminal Olefins in the Presence of Chloroplatinic Acid" J. Am. 10 Chem. Soc., Aug. 5, 1958, 80, 4104.

Sandanayaka, A. S. D., et al., "Photoinduced Electron-Transfer Processes between [C60]Fullerene and Triphenylamine Moieties Tethered by Rotaxane Structures. Through-Space Electron Transfer via Excited Triplet States of [60]Fullerene" The Journal of Physical Chemistry A, May 20, 2004, 108, 5145.

Sandanayaka, A. S. D., et al., "Photoinduced Intramolecular Electron-Transfer Processes in [60]Fullerene and N,NBis ( biphenyl)aniline Molecular Systems in Solutions" The Journal of Physical Chemistry A, Aug. 18, 2005, 109, 8088.

Schuster, D. I., et al., "Azobenzene-Linked Porphyrin-Fullerene Dyads" J. Am. Chem. Soc., Dec. 6, 2007, 129, 15973.

Seok, J. H., et al., "Photoinduced processes of newly synthesized bisferrocene- and bisfullerene-substituted tetrads with a triphenylamine central block" J. Organomet. Chem., 2009, 694, 1818.

Silvestri, F., et al, "Efficient Squaraine-Based Solution Processable Bulk-Heterojunction Solar Cells" Journal of the American Chemical Society, Dec. 5, 2008, 130, 17640.

Terao, J., et al., "Transition metal catalyzed carbon-silicon bond forming reactions using chlorosilanes promoted by Grignard reagents" The Chemical Record, 2007, 7, 57.

Van Hal, P. A., et al., "Photoinduced energy and electron transfer in oligo (p-phenylene vinylene)-fullerene dyads" Applied Physics A:Materials Science & Processing, 2004, 79, 41.

Ventura, B., et al., "Excited-State Dynamics in a Dyad Comprising Terpyridine-Platinum(II) Ethynylene Linked to Pyrrolidino-[60]Fullerene," Inorg. Chem., Jun. 15, 2009, 48, 6409.

Waldauf, C., et al., "Highly efficient inverted organic photovoltaics using solution based titanium oxide as electron selective contact" Appl. Phys. Lett., Dec. 8, 2006, 89, 233517.

Wolfrum, S., et al., "Utilization of Sc3N@C80 in long-range charge transfer reactions" Chemical Communications 2011, 47, 2270.

Xie, Q., et al., "Electrochemical detection of C606- and C706-: Enhanced stability of fullerides in solution" Journal of the American Chemical Society, Feb. 1992, 114, 3978.

Zhang, S., et al., "Ion recognition properties of self-assembled monolayers (SAMs)" Chemical Communications, Sep. 2006, 4461.

Zhang, S., et al., "Synthesis, Self-Assembled Monolayers and Alkaline Earth Metal Ion Recognition of p-tert-Butylcalix [4]arene Derivatives," Eur. J. Org. Chem., 2004, 2936.

Zhang, S., et al., "Self-assembled monolayers of different conformers of p-tertbutylcalix[4]crown-6 derivatives and their metal cation recognition properties," Tetrahedron Lett., Oct. 2003, 44, 9079.

Zhang, S.; Echegoyen, L. "Selective Anion Sensing by a Tris-Amide CTV Derivative:1H NMR Titration, Self-Assembled Monolayers, and Impedance Spectroscopy" J. Am. Chem. Soc., Jan. 22, 2005, 127, 2006.

* cited by examiner

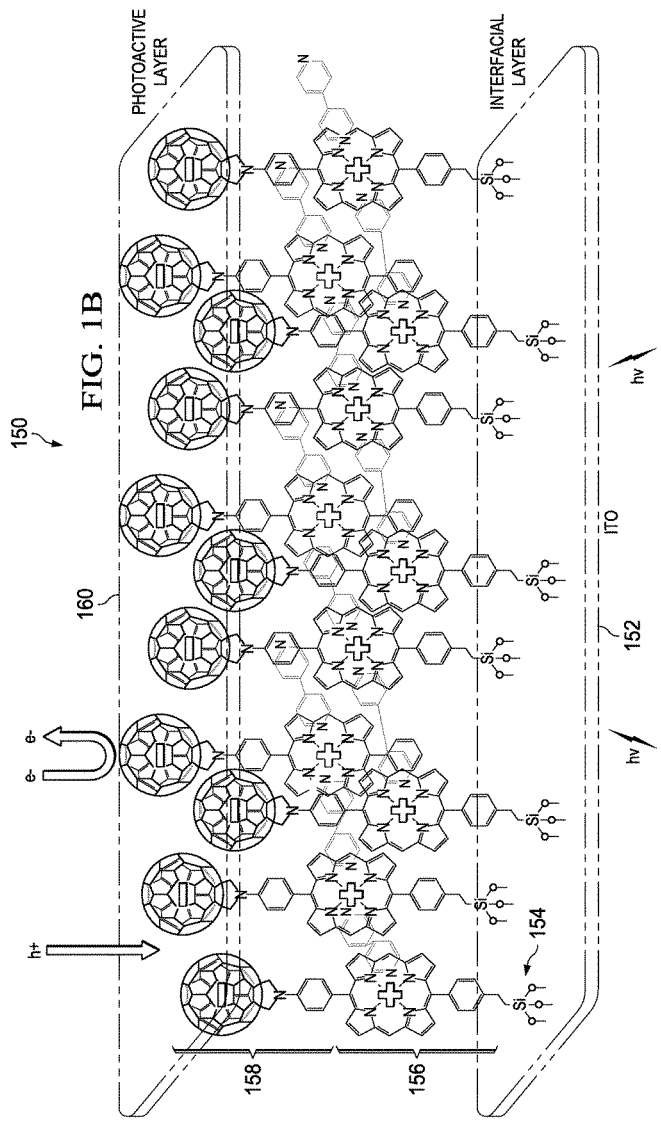

PHOTO-SWITCHABLE FULLERENE-BASED MATERIALS AS INTERFACIAL LAYERS IN ORGANIC PHOTOVOLTAICS

CROSS-REFERENCE TO RELATED APPLICATIONS

This application claims priority based on U.S. Provisional Application No. 61/538,494, filed Sep. 23, 2011. The contents of which is incorporated by reference in its entirety.

STATEMENT OF FEDERALLY FUNDED RESEARCH

This invention was made with government support under Grant No. FA9550-12-1-0053 awarded by Air Force Office of Scientific Research. The government has certain rights in the invention.

TECHNICAL FIELD OF THE INVENTION

The present invention relates in general to organic photovoltaic devices (OPV), and more particularly to designs and methods for improving OPV performance by the use of photo-switching, fullerene-based dyads of the design x-D-y-A or D-y-A-x as a polarized interfacial layer (IFL) in organic photovoltaics poles devices for efficient diode function.

REFERENCE TO A SEQUENCE LISTING

None.

BACKGROUND OF THE INVENTION

Without limiting the scope of the invention, its background is described in connection with interfacial layers in organic photovoltaic devices (OPV).

U.S. Pat. No. 7,799,990 issued to Marks et al. (2010) relates to a solar cell. In one embodiment, the solar cell includes an anode; an active organic layer comprising an electron-donating organic material and an electron-accepting organic material; a semiconducting layer formed between the anode and the active organic layer; and an electron-blocking layer (EBL) formed between the semiconducting layer and the active organic layer, where the EBL is transparent and adapted for blocking electron leakage from the active organic layer to the anode while transporting holes from the active organic layer to the anode.

U.S. Patent Application Publication No. 2009/0044855 (Irwin et al. 2009) relates to a solar cell, wherein the solar cell includes an anode, a p-type semiconductor layer formed on the anode, and an active organic layer formed on the p-type semiconductor layer, where the active organic layer has an electron-donating organic material and an electron-accepting organic material.

WIPO Patent Application WO/2010/059240 (Benson-Smith et al. 2010) discloses OPV devices comprising an organic semiconductor doped with a metal or organic dopant to form an interfacial modification layer, where the layer is disposed on an active layer including a conjugated polymer and a fullerene. In the layer, the organic semiconductor can be BPhen or TPBI, and the dopant can be a metal or an organic material. In the active layer, the conjugated polymer can be P3HT and the fullerene can be PCBM or indenyl-substituted fullerene. Improved OPV efficiency and lifetimes can be achieved.

SUMMARY OF THE INVENTION

The present invention describes the design and use of photo-switching, fullerene-based dyads as interfacial layers (IFL) for organic photovoltaic (OPV) devices. The fullerene-based dyads and triads of the present invention contain electron-donating substituents such as porphyrins (Por), pthalocyanines (Pcs), triphenylamines (TPAs), ferrocenes (Fc), dihydropyrene, or any combinations and modifications thereof, such as, fused electron donors (D-D) including porphyrins-triphenylamines (Por-TPAs), porphyrins-ferrocenes (Por-Fc), porphyrins-pyrenes, pthalocyanines-triphenylamines (Pcs-TPAs), phtalocyanines-ferrocenes (Pcs-Fc), or any combinations thereof that exhibit charge separation states with long lifetimes upon irradiation.

The present invention in one embodiment discloses a multilayer organic photovoltaic device (OPV) comprising one or more solar cells or units, wherein the solar cells or units comprise: (i) an anode comprising first electrically conductive electrode; (ii) a cathode comprising a second electrically conductive electrode; and (iii) an interfacial layer (IFL) sandwiched between the anode and/or the cathode and a photoactive layer (PAL). The IFL described herein comprises: a) an electron donor (D) or electron acceptor (A) anchored to the first electrode surface by one or more anchoring groups (x); and b) an electron acceptor (A) or electron donor (D) covalently linked either directly or through one or more linkers (y) to the electron donor (D) or electron acceptor (A), wherein the electron acceptor (A) or electron donor (D) is attached or is in close communication with the second electrode.

In one aspect of the OPV device described above the first, second or both electrically conductive electrodes comprise metals; oxides; sulfides; tellurides; nitrides; phosphides; selenides; graphene; cadmium oxide; titanium oxide; nickel oxide; tungsten oxide; vanadium oxide; molybdenum oxide; indium tin oxide (ITO); Al:ZnO (AZO); F:SnO$_2$ (FTO); gold; silver; aluminum; magnesium; calcium; platinum coated ITO glass; or combinations or modifications thereof. In another aspect the first, second or both electrodes may comprise an electrically conductive layer selected from one or more conductive elements comprising carbon; graphite; soot; carbon allotropes; or any combinations or modifications thereof. In yet another aspect the electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof. In another aspect the electron acceptor is selected from the group consisting of fullerenes ($C_{2n}$, n≥29); endohedral metallofullerenes ($M_x@C_{2n}$; M=Ce, Dy, Er, Gd, Ho, Lu, Sc, Y; x=1,2,3,4; n≥29); multimetallic endohedral fullerenes ($M_xE_y@C_{2n}$; M=Ce, Dy, Er, Ho, Lu, Sc, Y; E=N, O, S; x=2,3,4; y=1,2,3; n≥29); or any combinations and modifications thereof.

In other related aspects the anchoring groups (x) are selected from the group consisting of any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof and the one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof. In one aspect the IFL is anchored onto the first electrode surface as a monolayer, a bilayer or a greater multilayer. In a specific aspect the monolayer is a self-assembled monolayer (SAM).

Another embodiment described herein relates to a multilayer organic photovoltaic device (OPV) comprising one or more solar cells or units, wherein the solar cells or units comprise: an anode comprising first electrically conductive electrode; a cathode comprising a second electrically conductive electrode; and an interfacial layer (IFL) sandwiched between the anode and/or the cathode and a photoactive layer (PAL), wherein the IFL comprises: an electron donor (D) or electron acceptor (A) anchored to the first electrode surface by one or more anchoring groups (x) and an electron acceptor (A) or electron donor (D) covalently linked either directly or through one or more linkers (y) to the electron donor (D) or electron acceptor (A), wherein the electron acceptor (A) or electron donor (D) is attached or is in close communication with the second electrode. In one aspect the IFL is anchored onto the first electrode surface as a monolayer (a self-assembled monolayer), a bilayer or a greater multilayer.

In yet another embodiment the present invention provides a conductive or a photoactive layer (PAL) composition adapted for use in one or more organic photovoltaic devices or units, solar cells, or any combinations thereof comprising: an electron acceptor (A) layer or material, wherein the electron acceptor layer or material is anchored to a first electrode surface of the OPV device or the solar cell by one or more anchoring groups (x); and an electron donor (D) layer or material, wherein the electron donor layer or material covalently linked either directly or through one or more linkers (y) to the electron acceptor (A) and is attached or is in close communication with a second electrode of the OPV device or the solar cell. In one aspect the electron acceptor material is anchored onto the first electrode surface as a monolayer, a bilayer or a greater multilayer, wherein the monolayer is a self-assembled monolayer (SAM).

One embodiment of the instant invention relates to a conductive or a photoactive layer (PAL) composition adapted for use in one or more organic photovoltaic devices or units, solar cells, or any combinations thereof comprising: an electron donor (D) or electron acceptor (A) layer or material, wherein the electron donor (D) layer or acceptor (A) layer or material is anchored to a first electrode surface of the OPV device or the solar cell by one or more anchoring groups (x); and an electron acceptor (A) or electron donor (D) layer or material, wherein the electron acceptor (A) or electron donor (D) layer or material covalently linked either directly or through one or more linkers (y) to the electron donor (D) or acceptor (A) and is attached or is in close communication with a second electrode of the OPV device or the solar cell.

Another embodiment disclosed herein relates to an organic photovoltaic (OPV) device comprising: i) an anode comprising first electrically conductive electrode, ii) a cathode comprising a second electrically conductive electrode, and iii) an interfacial layer (IFL) sandwiched between the anode and/or the cathode and a photoactive layer (PAL), wherein the IFL comprises: (a) an electron donor (D) or electron acceptor (A) anchored to the first electrode surface by one or more anchoring groups (x); and (b) an electron acceptor (A) or electron donor (D) covalently linked either directly or through one or more linkers (y) to the electron donor (D) or electron acceptor (A), wherein the electron acceptor (A) or electron donor (D) is attached or is in close communication with the second electrode.

In another embodiment the instant invention discloses an organic photovoltaic (OPV) device comprising: i) a cathode comprising one or more flexible metals selected from the group consisting of gold, silver, aluminum, or any combinations thereof; ii) an anode comprising an indium tin oxide (ITO) electrode; iii) an interfacial photoactive layer (PAL) sandwiched between the anode and the cathode electrodes, wherein the interfacial PAL comprises: (a) a $C_{60}$ fullerene based electron acceptor (A) anchored to the cathode surface by one or more —$SiR_3$; —$SiCl_3$; —$SiOR_3$; anchoring groups (x), wherein the anchoring groups form a self-assembled monolayer (SAM) of the $C_{60}$ fullerene based electron acceptors on the cathode; and (b) porphyrins (Por) or triphenylamines (TPAs) based electron donors (D) covalently linked either directly or through one or more linkers selected from p-cyclophane units; phenylene groups; or any combinations thereof to the electron donors (D), wherein the electron donor is attached or is in close communication with the anode.

In yet another embodiment the instant invention relates to a method of making an organic photovoltaic (OPV) device comprising the steps of: (i) providing an anode electrode substrate, wherein the anode electrode surface is selected from the group consisting of indium tin oxide (ITO); Al:ZnO (AZO); F:$SnO_2$ (FTO); platinum coated ITO; or any combinations or modifications thereof; (ii) contacting the anode electrode substrate with a solution comprising one or more precursors capable of forming a photoactive interfacial layer (IFL), wherein the IFL comprises one or more dyads having an orientation given by Anchoring groups (x)-Donor (D)-Linker (y)-Acceptor (A); (iii) coating the anode electrode substrate with a photoactive layer (PAL), wherein the anode electrode substrate is spin-coated with the (PAL) solution; (iv) drying the coated PAL solution on the anode electrode substrate; and (v) depositing a metal to form a cathode electrode on the coated electrode substrate by high vacuum thermal evaporation or vapor deposition. In one aspect of the method provided hereinabove the IFL is an electron-blocking/hole-transporting (EB/HT) layer. In another aspect the PAL solution comprises any p-type electron donating material such as poly(3-hexylthiophene) (P3HT); poly[2,6-(4,4-bis-(2-ethylhexyl)-4H-cyclopenta[2,1-b;3,4-b']dithiophene)-alt-4,7-(2,1,3-benzothiadiazole)] (PCPDTBT); PTBx; and any n-type electron accepting material such as 1-(3-methoxycarbonyl)propyl-1-phenyl[6,6] C61 (PC60BM); 1-(3-methoxycarbonyl)propyl-1- phenyl[6,6] C71 (PC70BM); emeraldicene; or any combinations or modifications thereof. In yet another aspect the instant invention discloses an OPV device made by the method described hereinabove.

The present invention in one embodiment further provides a method of making an organic photovoltaic (OPV) device comprising the steps of: providing an anode electrode substrate, wherein the anode electrode surface is selected from the group consisting of indium tin oxide (ITO); Al:ZnO (AZO); F:$SnO_2$ (FTO); platinum coated ITO; or any combinations or modifications thereof; contacting the anode electrode substrate with a solution comprising one or more precursors capable of forming a photoactive interfacial layer (IFL), wherein the IFL comprises one or more dyads having an orientation given by Anchoring groups (x)-Acceptor (A)-Linker (y)-Donor (D); coating the anode electrode substrate with a photoactive layer (PAL), wherein the anode electrode substrate is spin-coated with the (PAL) solution;

drying the coated PAL solution on the anode electrode substrate; and depositing a metal to form a cathode electrode on the coated electrode substrate by high vacuum thermal evaporation or vapor deposition. In one aspect the IFL is a hole-blocking/electron-transporting (HBL/ETL) layer. In another aspect the PAL solution comprises any p-type electron donating material such as poly(3-hexylthiophene) (P3HT); poly[2,6-(4,4-bis-(2-ethylhexyl)-4H-cyclopenta[2,1-b;3,4-b'] dithiophene)-alt-4,7-(2,1,3-benzothiadiazole)] (PCPDTBT); PTBx; and any n-type electron accepting material such as 1-(3-methoxycarbonyl)propyl-1-phenyl[6,6] C61 (PC60BM); 1-(3-methoxycarbonyl)propyl-1-phenyl [6,6] C71 (PC70BM); emeraldicene; or any combinations or modifications thereof. In yet another aspect the present invention provides for an OPV device made by the method disclosed herein.

Finally, in another embodiment the instant invention provides a method of making an organic photovoltaic (OPV) device comprising the steps of: providing a cathode electrode substrate, wherein the cathode electrode substrate is made by a method comprising the steps of: i) providing a substrate, wherein the substrate is a glass substrate; ii) depositing or coating one or more metals onto the substrate, wherein the metals are selected from the group consisting of gold; silver; aluminum; calcium; or any combinations thereof, wherein the metal is coated or deposited onto the substrate by a thermal evaporation process; and iii) growing or forming a self-assembled monolayer (SAM) of a hole-blocking/electron-transporting (HBL/ETL) material on the metal coated substrate by contacting the substrate with a precursor capable of forming a photoactive interfacial layer (IFL), wherein the IFL comprises one or more dyads having an orientation given by Anchoring groups (x)-Acceptor (A)-Linker (y)-Donor (D); iv) providing an anode electrode substrate, wherein the anode electrode substrate is made by a method comprising the steps of: (a) providing a substrate selected from the group consisting of indium tin oxide (ITO); Al:ZnO (AZO); F:SnO$_2$ (FTO); platinum coated ITO; or any combinations or modifications thereof; (b) growing or forming a self-assembled monolayer (SAM) of an electron-blocking/hole-transporting (EB/HT) material on the substrate by contacting the substrate with a precursor capable of forming a photoactive interfacial layer (IFL), wherein the IFL comprises one or more dyads having an orientation given by Anchoring groups (x)-Donor (D)-Linker (y)-Acceptor (A); (c) depositing a photoactive layer (PAL) on the metal coated cathode comprising the SAM of the HBL/ETL material, wherein the PAL layer is deposited by a spin-coating process; and (d) placing the anode electrode comprising the SAM of the EB/HT material on the PAL and metal coated cathode, wherein the PAL promotes an adhesion of the anode electrode to the cathode electrode to form the OPV device.

The method as described hereinabove further comprises the optional steps of: promoting the adhesion of the anode electrode to the cathode electrode by a hot-press or any other suitable thermal adhesion process; and encapsulating or coating the OPV device with one or more polymers or polymeric coatings, wherein the polymer comprises polyp-xylylene) polymer. In one aspect the polymer or the polymeric coating comprises Parylene [poly(p-xylylene)], wherein the Parylene is selected from the group consisting of Parylene A; C; N; X; AF-4; SH; HT; and any combinations or modifications thereof. In another aspect the instant invention describes an OPV device made by the method described above.

The present invention provides an organic photovoltaic device (OPV) comprising: an anode comprising first electrically conductive electrode; a cathode comprising a second electrically conductive electrode; and an interfacial layer (IFL) sandwiched between the anode and/or the cathode and a photoactive layer (PAL), wherein the IFL comprises: an electron donor (D) or electron acceptor (A) anchored to the first electrode surface by one or more anchoring groups (x); and an electron acceptor (A) or electron donor (D) covalently linked either directly or through one or more linkers (y) to the electron donor (D) or electron acceptor (A), wherein the electron acceptor (A) or electron donor (D) is attached or is in close communication with the second electrode. The first, second or both electrically conductive electrodes may comprise metals; oxides; sulfides; tellurides; nitrides; phosphides; selenides; graphene; cadmium oxide; titanium oxide; nickel oxide; tungsten oxide; vanadium oxide; molybdenum oxide; indium tin oxide (ITO); Al:ZnO (AZO); F:SnO$_2$ (FTO); gold; silver; aluminum; magnesium; calcium; platinum coated ITO glass; or combinations or modifications thereof. The first, second or both electrodes may comprise an electrically conductive layer selected from one or more conductive elements comprising carbon; graphite; soot; carbon allotropes; or any combinations or modifications thereof. The electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof and, wherein the electron acceptor is selected from the group consisting of fullerenes ($C_{2n}$, n≥29); endohedral metallofullerenes ($M_x@C_{2n}$; M=Ce, Dy, Er, Gd, Ho, Lu, Sc, Y; x=1,2,3,4; n≥29); multimetallic endohedral fullerenes ($M_xE_y@C_{2n}$; M=Ce, Dy, Er, Ho, Lu, Sc, Y; E=N, O, S; x=2,3,4; y=1,2,3; n≥29); or any combinations and modifications thereof. The anchoring groups (x) are selected from the group consisting of any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof and wherein the one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof. The IFL is anchored onto the first electrode surface as a monolayer, a bilayer or a greater multilayer. The monolayer is a self-assembled monolayer (SAM).

The present invention provides a multilayer organic photovoltaic device (OPV) comprising one or more solar cells or units, wherein the solar cells or units comprise an anode comprising a first electrically conductive electrode; a cathode comprising a second electrically conductive electrode; and an interfacial layer (IFL) sandwiched between the anode and/or the cathode and a photoactive layer (PAL), wherein the IFL comprises: an electron donor (D) or electron acceptor (A) anchored to the first electrode surface by one or more anchoring groups (x); and an electron acceptor (A) or electron donor (D) covalently linked either directly or through one or more linkers (y) to the electron donor (D) or electron acceptor (A), wherein the electron acceptor (A) or electron donor (D) is attached or is in close communication with the second electrode.

The first, the second or both electrically conductive electrodes may comprise metals; oxides; sulfides; tellurides; nitrides; phosphides; selenides; graphene; cadmium oxide; titanium oxide; nickel oxide; tungsten oxide; vanadium oxide; molybdenum oxide; indium tin oxide (ITO); Al:ZnO (AZO); F:SnO$_2$ (FTO); gold; silver; aluminum; magnesium; calcium; platinum coated ITO glass; or combinations or modifications thereof. The first, the second, or both electrodes may comprise an electrically conductive layer selected from one or more conductive elements comprising carbon; graphite; soot; carbon allotropes; or any combinations or modifications thereof. The electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof. The electron acceptor is selected from the group consisting of fullerenes ($C_{2n}$, n≥29); endohedral metallofullerenes ($M_x@C_{2n}$; M=Ce, Dy, Er, Gd, Ho, Lu, Sc, Y; x=1,2,3,4; n≥29); multimetallic endohedral fullerenes ($M_xE_y@C_{2n}$; M=Ce, Dy, Er, Ho, Lu, Sc, Y; E=N, O, S; x=2,3,4; y=1,2,3; n≥29); or any combinations and modifications thereof. The anchoring groups (x) are selected from the group consisting of any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof. The one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof. The IFL is anchored onto the first electrode surface as a monolayer, a bilayer, or a greater multilayer. One embodiment includes instances where the monolayer is a self-assembled monolayer (SAM).

The present invention provides a conductive or a photoactive layer (PAL) composition adapted for use in one or more organic photovoltaic devices or units, solar cells, or any combinations thereof comprising: an electron acceptor (A) layer or material, wherein the electron acceptor layer or material is anchored to a first electrode surface of the OPV device or the solar cell by one or more anchoring groups (x); and an electron donor (D) layer or material, wherein the electron donor layer or material covalently linked either directly or through one or more linkers (y) to the electron acceptor (A) and is attached or is in close communication with a second electrode of the OPV device or the solar cell. The electron acceptor material is anchored onto the first electrode surface as a monolayer, a bilayer, or a greater multilayer, wherein the monolayer is a self-assembled monolayer (SAM).

The present invention provides a conductive or a photoactive layer (PAL) composition adapted for use in one or more organic photovoltaic devices or units, solar cells, or any combinations thereof comprising: an electron donor (D) or electron acceptor (A) layer or material, wherein the electron donor (D) layer or acceptor (A) layer or material is anchored to a first electrode surface of the OPV device or the solar cell by one or more anchoring groups (x); and an electron acceptor (A) or electron donor (D) layer or material, wherein the electron acceptor (A) or electron donor (D) layer or material covalently linked either directly or through one or more linkers (y) to the electron donor (D) or acceptor (A) and is attached or is in close communication with a second electrode of the OPV device or the solar cell. The electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof. The electron acceptor is selected from the group consisting of fullerenes ($C_{2n}$, n≥29); endohedral metallofullerenes ($M_x@C_{2n}$; M=Ce, Dy, Er, Gd, Ho, Lu, Sc, Y; x=1,2,3,4; n≥29); multimetallic endohedral fullerenes ($M_xE_y@C_{2n}$; M=Ce, Dy, Er, Ho, Lu, Sc, Y; E=N, O, S; x=2,3,4; y=1,2,3; n≥29); or any combinations and modifications thereof. The anchoring groups (x) are selected from the group consisting of any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof. The one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof. The electron donor material is anchored onto the first electrode surface as a monolayer, a bilayer or a greater multilayer, wherein the monolayer is a self-assembled monolayer (SAM).

The present invention provides an organic photovoltaic (OPV) device comprising: an anode comprising a first electrically conductive electrode; a cathode comprising a second electrically conductive electrode; and an interfacial layer (IFL) sandwiched between the anode and/or the cathode and a photoactive layer (PAL), wherein the IFL comprises: an electron donor (D) or electron acceptor (A) anchored to the first electrode surface by one or more anchoring groups (x); and an electron acceptor (A) or electron donor (D) covalently linked either directly or through one or more linkers (y) to the electron donor (D) or electron acceptor (A), wherein the electron acceptor (A) or electron donor (D) is attached or is in close communication with the second electrode. The first, second, or both electrically conductive electrodes comprise metals; oxides; sulfides; tellurides; nitrides; phosphides; selenides; graphene; cadmium oxide; titanium oxide; nickel oxide; tungsten oxide; vanadium oxide; molybdenum oxide; indium tin oxide (ITO); Al:ZnO (AZO); F:SnO$_2$ (FTO); gold; silver; aluminum; magnesium; calcium; platinum coated ITO glass; or combinations or modifications thereof. The first, second or both electrodes may comprise an electrically conductive layer selected from one or more conductive elements comprising carbon; graphite; soot; carbon allotropes; or any combinations or modifications thereof.

The present invention provides an organic photovoltaic (OPV) device comprising: a cathode comprising one or more flexible metals selected from the group consisting of gold, silver, aluminum, or any combinations thereof; an anode comprising an indium tin oxide (ITO) electrode; and an interfacial photoactive layer (PAL) sandwiched between the anode and the cathode electrodes, wherein the interfacial PAL comprises: a C$_{60}$ fullerene based electron acceptor (A)

anchored to the cathode surface by one or more —SiR$_3$; —SiCl$_3$; —SiOR$_3$; anchoring groups (x), wherein the anchoring groups form a self-assembled monolayer (SAM) of the C$_{60}$ fullerene based electron acceptors on the cathode; and porphyrins (Por) or triphenylamines (TPAs) based electron donors (D) covalently linked either directly or through one or more linkers selected from p-cyclophane units; phenylene groups; or any combinations thereof to the electron donors (D), wherein the electron donor is attached or is in close communication with the anode.

The present invention provides a method of making an organic photovoltaic (OPV) device by providing an anode electrode substrate, wherein the anode electrode substrate is selected from the group consisting of metals; oxides; sulfides; tellurides; nitrides; phosphides; selenides; graphene; cadmium oxide; titanium oxide; nickel oxide; tungsten oxide; vanadium oxide; molybdenum oxide; indium tin oxide (ITO); Al:ZnO (AZO); F:SnO$_2$ (FTO); gold; silver; aluminum; magnesium; calcium; platinum coated ITO glass; or any combinations or modifications thereof; contacting the anode electrode substrate with a solution comprising one or more precursors capable of forming a photoactive interfacial layer (IFL), wherein the IFL comprises one or more dyads having an orientation given by Anchoring groups (x)-Donor (D)-Linker (y)-Acceptor (A); coating the anode electrode substrate with a photoactive layer (PAL), wherein the anode electrode substrate is spin-coated with the (PAL) solution; drying the coated PAL solution on the anode electrode substrate; and depositing a metal to form a cathode electrode on the coated electrode substrate by high vacuum thermal evaporation or vapor deposition. The anode, the cathode or both may comprise an electrically conductive layer selected from one or more conductive elements comprising carbon; graphite; soot; carbon allotropes; or any combinations or modifications thereof. The one or more metals that form the cathode electrode are selected from the group consisting of gold; silver; aluminum; or any combinations thereof. The electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof, wherein the electron acceptor is selected from the group consisting of fullerenes (C$_{2n}$, n≥29); endohedral metallofullerenes (M$_x$@C$_{2n}$; M=Ce, Dy, Er, Gd, Ho, Lu, Sc, Y; x=1,2,3,4; n≥29); multimetallic endohedral fullerenes (M$_x$E$_y$@C$_{2n}$; M=Ce, Dy, Er, Ho, Lu, Sc, Y; E=N, O, S; x=2,3,4; y=1,2,3; n≥29); or any combinations and modifications thereof, wherein the anchoring groups (x) are selected from the group consisting of any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof, wherein the one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof, wherein the metal to form the cathode is selected from the group consisting of gold; silver; aluminum; or any combinations thereof. The IFL is an electron-blocking/hole-transporting (EBL/HTL) layer. The PAL solution comprises any p-type electron donating material such as poly(3-hexylthiophene) (P3HT); poly[2,6-(4,4-bis-(2-ethylhexyl)-4H-cyclopenta[2,1-b;3,4-b']dithiophene)-alt-4,7-(2,1,3-benzothiadiazole)] (PCPDTBT); PTBx; and any n-type electron accepting material such as 1-(3-methoxycarbonyl) propyl-1-phenyl[6,6] C61 (PC60BM); 1-(3-methoxycarbonyl)propyl-1-phenyl[6,6] C71 (PC70BM); emeraldicene; or any combinations or modifications thereof. An OPV device made by the method above.

The present invention provides a method of making an organic photovoltaic (OPV) device by providing an anode electrode substrate, wherein the anode electrode surface is selected from the group consisting of indium tin oxide (ITO); Al:ZnO (AZO); F:SnO$_2$ (FTO); platinum coated ITO; or any combinations or modifications thereof; contacting the anode electrode substrate with a solution comprising one or more precursors capable of forming a photoactive interfacial layer (IFL), wherein the IFL comprises one or more dyads having an orientation given by Anchoring groups (x)-Acceptor (A)-Linker (y)-Donor (D); coating the anode electrode substrate with a photoactive layer (PAL), wherein the anode electrode substrate is spin-coated with the (PAL) solution; drying the coated PAL solution on the anode electrode substrate; and depositing a metal to form a cathode electrode on the coated electrode substrate by high vacuum thermal evaporation or vapor deposition. The electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof. The electron acceptor is selected from the group consisting of fullerenes (C$_{2n}$, n≥29); endohedral metallofullerenes (M$_x$@C$_{2n}$; M=Ce, Dy, Er, Gd, Ho, Lu, Sc, Y; x=1,2,3,4; n≥29); multimetallic endohedral fullerenes (M$_x$E$_y$@C$_{2n}$; M=Ce, Dy, Er, Ho, Lu, Sc, Y; E=N, O, S; x=2,3,4; y=1,2,3; n≥29); or any combinations and modifications thereof. The anchoring groups (x) are selected from the group consisting of any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof. The one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof. The metal to form the cathode is selected from the group consisting of gold; silver; aluminum; or any combinations thereof. The IFL is a hole-blocking/electron-transporting (HBL/ETL) layer. The PAL solution comprises any p-type electron donating material such as poly(3-hexylthiophene) (P3HT); poly[2,6-(4,4-bis-(2-ethylhexyl)-4H-cyclopenta[2,1-b;3,4-b'] dithiophene)-alt-4,7-(2,1,3-benzothiadiazole)] (PCPDTBT); PTBx; and any n-type electron accepting material such as 1-(3-methoxycarbonyl)propyl-1-phenyl [6,6] C61 (PC60BM); 1-(3-methoxycarbonyl)propyl-1-phenyl[6,6] C71 (PC70BM); emeraldicene; or any combinations or modifications thereof.

The present invention provides a method of making an organic photovoltaic (OPV) device by providing a cathode electrode substrate, wherein the cathode electrode substrate is made by a method by providing a substrate, wherein the substrate is a glass substrate; depositing or coating one or more metals onto the substrate, wherein the metals are selected from the group consisting of gold; silver; aluminum; calcium; or any combinations thereof, wherein the metal is coated or deposited onto the substrate by a thermal evaporation process; and growing or forming a self-assembled monolayer (SAM) of a hole-blocking/electron-transporting (HBL/ETL) material on the metal coated substrate by contacting the substrate with a precursor capable of forming a photoactive interfacial layer (IFL), wherein the IFL comprises one or more dyads having an orientation given by Anchoring groups (x)-Acceptor (A)-Linker (y)-Donor (D); providing an anode electrode substrate, wherein the anode electrode substrate is made by a method comprising the steps of: providing a substrate selected from the group consisting of indium tin oxide (ITO); Al:ZnO (AZO); F:SnO$_2$ (FTO); platinum coated ITO; or any combinations or modifications thereof; and growing or forming a self-assembled monolayer (SAM) of an electron-blocking/hole-transporting (EB/HT) material on the substrate by contacting the substrate with a precursor capable of forming a photoactive interfacial layer (IFL), wherein the IFL comprises one or more dyads having an orientation given by Anchoring groups (x)-Donor (D)-Linker (y)-Acceptor (A); depositing a photoactive layer (PAL) on the metal coated cathode comprising the SAM of the HBL/ETL material, wherein the PAL layer is deposited by a spin-coating process; and placing the anode electrode comprising the SAM of the EB/HT material on the PAL and metal coated cathode, wherein the PAL promotes an adhesion of the anode electrode to the cathode electrode to form the OPV device. The method further comprising the optional steps of: promoting the adhesion of the anode electrode to the cathode electrode by a hot-press or any other suitable thermal adhesion process; and encapsulating or coating the OPV device with one or more polymers or polymeric coatings, wherein the polymer comprises polyp-xylylene) polymer. The polymer or the polymeric coating comprises Parylene [poly(p-xylylene)], wherein the Parylene is selected from the group consisting of Parylene A; C; N; X; AF-4; SH; HT; and any combinations or modifications thereof. The electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof. The electron acceptor is selected from the group consisting of fullerenes ($C_{2n}$, n≥29); endohedral metallofullerenes ($M_x@C_{2n}$; M=Ce, Dy, Er, Gd, Ho, Lu, Sc, Y; x=1,2,3,4; n≥29); multimetallic endohedral fullerenes ($M_xE_y@C_{2n}$; M=Ce, Dy, Er, Ho, Lu, Sc, Y; E=N, O, S; x=2,3,4; y=1,2,3; n≥29); or any combinations and modifications thereof. The anchoring groups (x) are selected from the group consisting any silane (—SiR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof. The one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof.

BRIEF DESCRIPTION OF THE DRAWINGS

For a more complete understanding of the features and advantages of the present invention, reference is now made to the detailed description of the invention along with the accompanying figures and in which:

FIG. 1B is an example of the photo-switched fullerene-based IFL anchored by silicon moieties to the ITO electrode in the form of a self-assembled monolayer (SAM);

DETAILED DESCRIPTION OF THE INVENTION

Figure 1A:
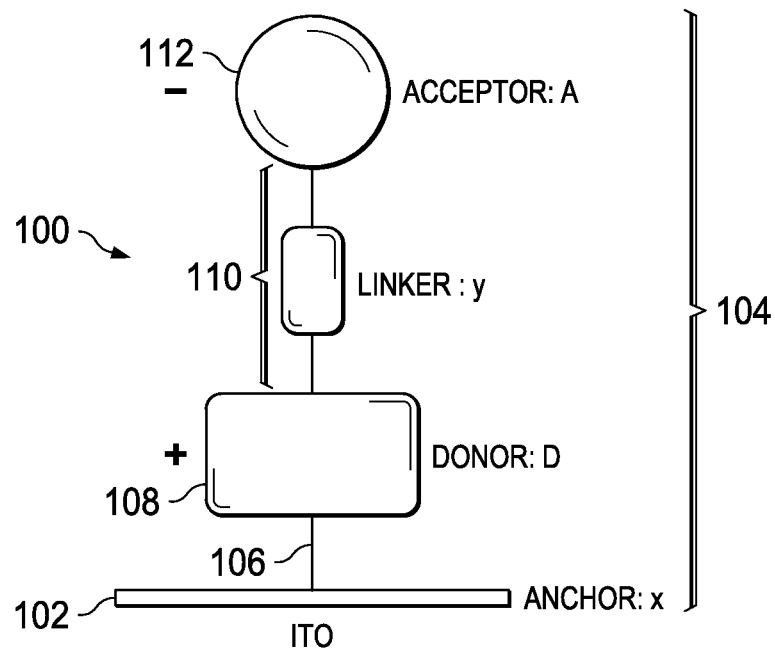
FIG. 1A is a schematic showing the structure of the anode photo-switching fullerene-based dyad (-x-D-y-A) IFL material.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an," and "the" are not intended to refer to only a singular entity, but include the general class of which a specific example may be used for illustration. The terminology herein is used to describe specific embodiments of the invention, but their usage does not delimit the invention, except as outlined in the claims.

As used herein the "photovoltaic", also abbreviated as (PV), refers to the direct conversion of light energy into electricity. As used herein, the term "photovoltaic device" refers to a complete set of components for converting light energy into electricity by the photovoltaic process. The term "electrically conductive" is used herein to describe a property of a material that involves its ability to transfer electricity.

The term "semiconductor" in its broadest sense refers to a material that has an electrical conductivity due to flowing electrons (as opposed to ionic conductivity) which is intermediate in magnitude between that of a conductor and an insulator. Semiconductor devices include the various types of transistor, solar cells, many kinds of diodes including the light-emitting diode, the silicon controlled rectifier, and digital and analog integrated circuits.

The present invention describes photo-switching, fullerene-based dyads of the design x-D-y-A or D-y-A-x as interfacial layers (IFL) for organic photovoltaic (OPV) devices. Upon irradiation, an intramolecular electron transfer process from the donor to the acceptor creates a charge separated state. As an anode IFL, the negative charges on the acceptors will create a negative charge barrier between the photoactive layer and the transparent conducting electrode (TCE), rejecting electrons from reaching the electrode and concurrently promoting the conduction of holes. This will has a strong rectifying effect on the whole device, not just the interfaces, resulting in improved charge extraction from the interior of the photo-active layer.

The invention also describes anchoring an IFL to the ITO surface as a monolayer, bilayer, or greater multilayers. One OPV design embodiment of the present invention embodiment involves the formation of covalent bonds via silane groups (—$SiR_3$) as the anchor (x), to form siloxane bonds. This embodiment is an example of a self-assembled monolayer (SAM) of organic molecules on the surface of ITO thin films electrodes. Other anchoring groups in carboxylate and diazonium ions.

Figure 2A:
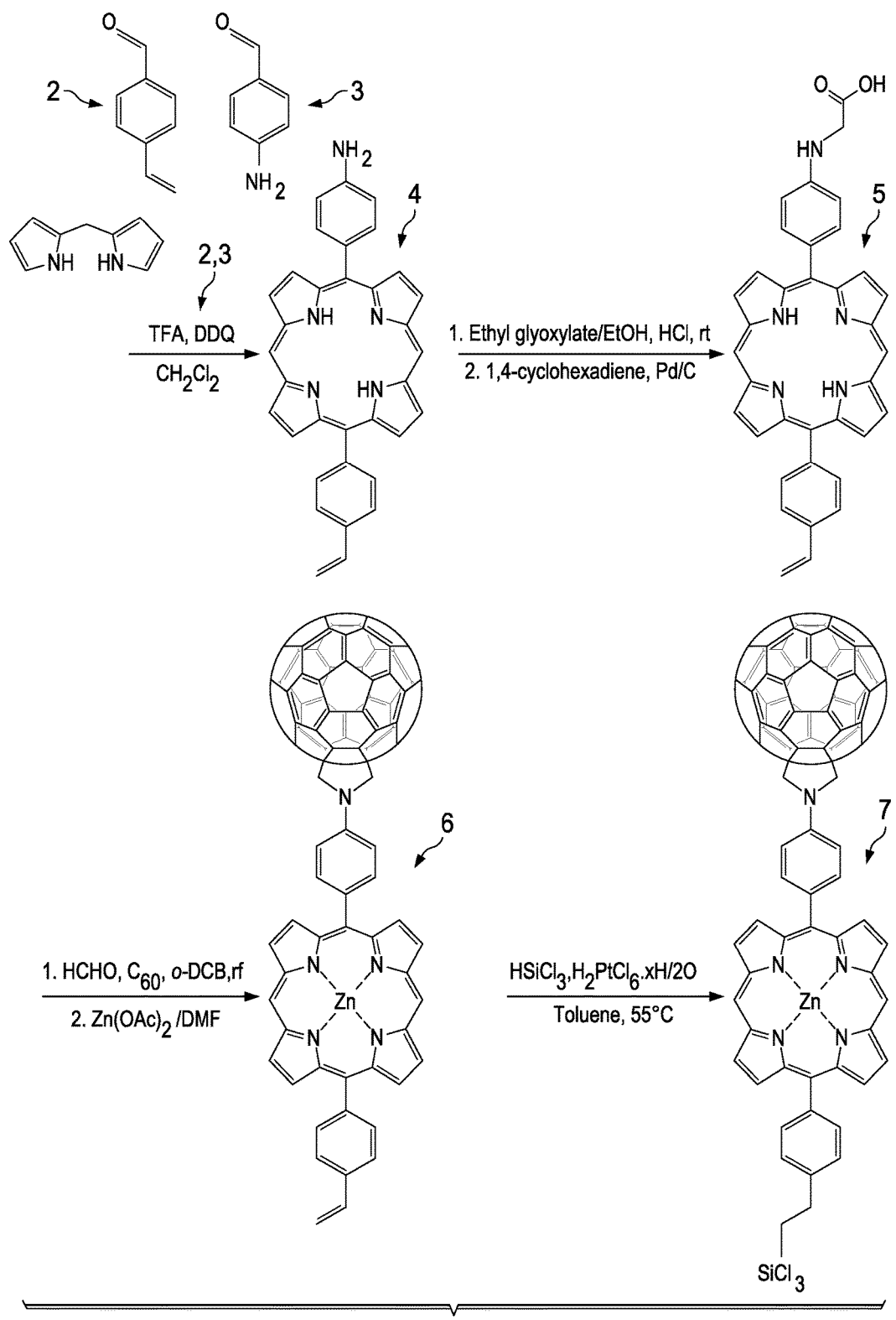
FIGS. 2A-2F show different schemes for the synthetic design of the fullerene-based dyads of the present invention.

The example IFL material is presented in FIG. 1B and contains a porphyrin ring as the donor (D) and a fullerene as the acceptor (A) with a phenylene linker (y). The synthetic design for the elaboration of this dyad example is shown in FIG. 2A. The desired 5,15-substituted porphyrin (4) will be obtained by linking benzaldehydes (2) and (3) with 2,2'-dipyrromethane. Coupling of ethyl glyoxylate with amine (4), and further reduction of the resulting imine with 1,4-cyclohexadiene will afford glycine (5). A 1,3-dipolar cycloaddition reaction, better known as a Prato reaction, between glycine (5), $C_{60}$, and paraformaldehyde in refluxing o-DCB will yield an N-phenylporphyrinfulleropyrrolidine intermediate. After treatment of this intermediate with $Zn(OAc)_2$, the N-phenylmetalloporphyrinfulleropyrrolidine (6) will be obtained. Hydrosilation of the vinyl group with Speier's catalyst will afford organosilane (7).

A significant obstacle to be overcome in OPV research is the proper collection of charge carriers; i.e., control of charge carrier diffusion and drift mechanisms to maximize overall charge carrier collection while minimizing errant (or reverse) charge collection.[1-6] Mechanisms by which this can be accomplished include: (i) proper orbital energy level alignment to efficiently collect majority carriers while blocking minority carriers, (ii) creation of depletion regions to improve diffusion, and (iii) polarization of the OPV to increase drift velocity. So far, charge transport/blocking has been the primary mechanism driving anode and cathode interfacial layer (IFL) research.[3-6] The present invention provides a novel method for addressing all three mechanisms presented hereinabove.

The most efficient design to date for OPVs contains a photo-active layer (PAL) comprised of p- and n-type organic materials intimately mixed to form a bulk-heterojunction (BHJ). Simply, a homogeneous solution of the PAL materials is deposited on a transparent conducting electrode (TCE) substrate, and the individual p- and n-type materials are allowed to phase separate to form nano-domains.[7] This is accomplished by slow drying of the layer with high-boiling point solvents, thermal annealing, or a combination of the two. This design has a shortcoming in that both the PAL materials are in contact with the two electrodes. This creates a facile environment for minority charge carrier collection, and this issue is addressed in the present invention with an anode electron-blocking/hole-transporting (EB/HT)[3-6] layer and/or a cathode hole-blocking/electron-transporting (HBL/ETL)[8-11] layer. These materials are often simple in composition, as exemplified by NiO[5,12] and bathocuproine[10-11], but they must meet a few core requirements: i) be conductive to the majority carrier and resistive to the minority carrier (p-type at the anode, n-type at the cathode), ii) have the correct work function to be capable of ohmic contact with the PAL materials, iii) have a sufficiently off-set valence/conduction band or HOMO/LUMO energy to present a significant barrier to minority carrier collection (e.g., a high-energy conduction band for EBLs), and iv) be sufficiently transparent in the spectrally responsive region of the PAL.

A significant driving force behind OPV interface research is the widely accepted short-comings of the standard anode materials, tin-doped indium oxide (ITO, typical OPV anode) and poly(3,4-ethylenedioxythiophene):poly(styrenesulfonate) (PEDOT:PSS) as the interfacial layer. Each material exhibits considerable electrical and compositional inhomogeneity.[13-15] Electrode surface inhomogeneity introduces spatially varying work functions, limited effective interfacial area for efficient charge collection, and detrimental charge traps. Additionally, an often ignored component of OPV device performance is durability.[16-17] Irwin et al.,[6] Hains, et al.,[3] and Betancur, et al.,[18] have shown PEDOT:PSS to be the weak link in OPV device stability with PEDOT:PSS-based devices failing in as little as an hour,[3] and OPV devices lasting almost 5000 hours[6] with PEDOT:PSS exclusion.

Anode IFL research has seen success with aforementioned NiO,[5,12] poly[9,9-dioctylfluorene-co-N-[4-(3-methylpropyl)]-diphenylamine] (TFB):4,4'-bis [(p-trichlorosilylpropylphenyl)phenylamino]biphenyl (TPDSi2),[3] 5,5'-bis [(p-trichlorosilylpropylphenyl)-phenylamino]-2,2'-bithiophene (PABTSi2),[4] and HCl-treated ITO (no IFL).[6] In each circumstance, improved ohmic contact between the $HOMO_{donor}$ and the EB/HT IFL work function was the primary goal. The IFL was chosen based on the $HOMO_{donor}$ of poly(3-hexylthiophene) (P3HT, 5.0 eV), with the exception of TFB:TPDSi$_2$[3] which was based on poly[2-methoxy-5-(3',7'-dimethyloctyloxy)-p-phenylenevinylene] (MDMO-PPV, 5.3 eV). An issue of equal importance to IFL research is surface homogenization, i.e., the minimization of charge traps. With inhomogeneous surfaces, locations exist which are detrimental charge recombination centers introducing multiple diodes into the equivalent circuit and consuming current-producing charge carriers. It was shown in the cases of NiO and HCl-treated ITO that significant homogenization accompanied substrate treatment, as shown by conductive atomic force microscopy (cAFM).

Like PEDOT:PSS, the use of LiF as a cathode IFL originated from organic light-emitting diode (OLED) research.[19-20] LiF is vapor deposited to a thickness of only a few angstroms to form what is, to date, a poorly-understood IFL.[21-22] LiF alternatives are limited; however, Bazan and Heeger have been very successful with solution-derived $TiO_x$,[8,23] and the polyelectrolytes poly[3-(6-trimethylammoniumhexyl)thiophene] (P3TMAHT) and poly[(9,9-bis(2-ethylhexyl)-fluorene]-b-poly[3-(6-trimethylammoniumhexyl)thiophene] (PF2/6-b-P3TMAHT),[9] with efficiency increases up to 25% reported with ETL/HBL layer inclusion.

An alternative approach to EBL/HBL layer design that is rarely utilized but particularly relevant to the present application is electrical polarization. If one were able to successfully polarize BHJ OPVs, an increase in charge carrier drift velocity towards the appropriate electrodes would be expected. It has been previously demonstrated that, self-assembled monolayers (SAMs) of propyl chlorosilanes on ITO were terminated with either —$CH_3$, —$NH_2$, or —$CF_3$.[24] In this series the SAM dipole increases towards the PAL from non-polar to highly polar. These being anode SAMs where holes are collected, device efficiency trends were as expected with the $CF_3$-terminated SAMs having the highest photoconversion efficiency (PCE) due to the largest dipole (bare ITO=0.73%, —$CH_3$=1.24%, —$NH_2$=0.95%, —$CF_3$=3.15%). A more recent example of a polarized SAM used as an IFL in small-molecule OPVs showed an 85% increase in the open circuit voltage ($V_{oc}$) and a three-fold increase in the PCE as compared to an equivalent control device.[25]

The design, synthesis, and analysis of such interfacial materials by the use of zwitterionic molecular components to increase SAM polarity is described herein. These compounds are conceptually derived from an extensive literature that describes covalently linked Donor-Acceptor (D-A) dyads which, upon photoexcitation, undergo intramolecular electron transfer from the donor to the acceptor, to yield $D^+$-$A^-$ charge separated states. A brief summary of the most relevant results in this area is presented herein below, to provide the conceptual framework for some of the proposed structures and their anticipated properties.

D-A Dyads: Considerable structural and functional diversity has been incorporated in photoswitched D-A systems for the development and improvement of OPVs.[26] The lifetimes of the charge-separated (CS) states ($D^+$-$A^-$) are important to realize effective charge separation in organic solar cell devices. Efforts to improve the spectral absorption of the D-A conjugates and to increase the CS state lifetimes have yielded very interesting and encouraging results. Fullerenes, typically $C_{60}$, are the most commonly used electron acceptors in dyads, mainly because of their favorable electron accepting abilities, three-dimensionality, and small reorganization energies upon electron transfer.[27-31] Among the different electron donor moieties that have been employed in D-A conjugates; porphyrins (Por),[31-39] phthalocyanines (Pcs),[40-42] triphenylamines (TPAs)[43-48] ferrocenes,[49-51] among others,[52-58] are the most studied.

Imahori, et al. have reported how the lifetimes of photoinduced $D^+$-y-$A^-$ conjugates, where y is a covalent linker, are dependent on the nature of the solvent and of the linker for zinc-porphyrin-$C_{60}$ dyads.[30] Changing the linking position of the phenyl ring linkers from positions ortho, meta and para, they were able to observe dramatic changes in the lifetimes. Regardless of the position of the linkers, the lifetimes were in the picosecond regime, proving that $C_{60}$ is an effective electron acceptor in artificial photosynthetic systems. D'Souza, et al. showed that the proximity of the D to the A affects the CS state lifetime, and obtained lifetime values in the ns regime.[32] Guldi, et al. also studied the importance of the orientation of the donor and acceptor in electron transfer reactions.[33-34] They were able to determine that the magnitude of the $\pi$-$\pi$ interactions is the crucial parameter that controls rates, efficiencies, and mechanisms of electron transfer. They also studied the charge-transfer interactions in topologically different Por-$C_{60}$ dyads. They showed that the same D and A groups can lead to widely different lifetimes, with time constants ranging from the μs to the ps regime with low reorganization energies. Kesti, et al. compared the charge separation of $C_{60}$ and $C_{70}$ in analogous zinc-porphyrin-fullerene dyads,[35] and observed a 50% longer lifetime for the $C_{70}$ compound. The charge separated state of the $C_{70}$ dyad exhibited a lifetime of 890 ps compared to 590 ps for its $C_{60}$ analogue, showing the significant effect of different electron accepting fullerenes. Some research groups have synthesized three-chromophore systems, called triads. These systems consist of either D-D-A or A-A-D structures. Liddell, et al. studied dihydropyrene(D)-porphyrin(P)-fullerene(A) triads.[36] In these systems, lifetimes of the charge-separated states are longer since the back electron transfer (BET) is slowed by two electron transfer processes. Liddell reported triads with CS lifetimes in the of ps and μs regimes. Schuster, et al. reported azobenzene-linked porphyrin-fullerene dyads to probe the effect of the linker.[37] Many other dyad and triad examples containing Por donors have also been reported.

TPA donors have attracted much attention because of their relatively strong light absorption properties, the high stabilities of their corresponding radical cations, and excellent hole transporting ability. All of these are crucial requirements for the preparation of efficient OPVs. Sandanayaka, et al. studied through-space electron transfer of rotaxanes with TPA and crown ethers attached to $C_{60}$. CS lifetimes in the range of ps and ns were observed.[43] An interesting result from their study was that shorter lifetimes were observed for covalently bonded $C_{60}$-TPA dyad systems. They observed rapid charge separation through the singlet-excited state of $C_{60}$ but faster charge recombination, while the long charge separated states of the rotaxanes occur through the triplet excited state of the $C_{60}$ in polar solvents. The results depend on rotaxane structure, solvent polarity, and temperature.

Endohedral metallofullerenes (EMF) have also been employed by different research groups to assemble artificial photosynthetic dyad conjugates. EMFs exhibit much higher absorption coefficients than $C_{60}$ in the visible region and have low HOMO-LUMO energy gaps (or bandgaps, $E_g$) while preserving electron-accepting properties similar to those of $C_{60}$. The present inventors have previously reported photoinduced intramolecular electron transfer reaction involving an EMF-based donor-acceptor dyad.[59] They also reported pyrrolidine and cyclopropane derivatives of the trimetallic nitride (TMN) endohedral metallofullerenes $I_h$-$Sc_3N@C_{80}$ and $I_h$-$Y_3N@C_{80}$ connected to an electron donor moiety.[60] A ferrocenyl-$Sc_3N@C_{80}$-fulleropyrrolidine dyad (128 ps in $CS_2$) exhibited a CS lifetime three times longer than that for the corresponding $C_{60}$ compound (46 ps in $CS_2$). Other studies confirmed that the $I_h$-$Sc_3N@C_{80}$ acceptor exhibits considerably longer lived photoinduced CS states and lower first reduction potentials than their corresponding $C_{60}$ dyads, confirming the advantage of using EMFs in place of $C_{60}$ in donor-acceptor conjugates.[60]

The present inventors have also demonstrated that photoinduced charge-separated states with excited state lifetimes in the μs regime can be obtained for dyads that incorporate an electron donor Por coupled to a TMN fullerene electron acceptor via an aromatic linker containing a p-cyclophane unit.[61] In these cases, both the nature of the TMN acceptor as well as the electronic structure of the p-cyclophane linker contributes to the dramatically long CS states.

The selected examples of Por- and TPA-based dyads and triads, along with empty fullerenes and TMN endohedral acceptors form the basis of photoswitched IFL design of the present invention. In previous studies the fullerenes were anchored to electrode surfaces and were performed with alternative goals. Imahori and Fukuzumi created a D-A structure of Por-$C_{60}$ anchored to Au via sulfide linkages to form photochemical devices similar to dye-sensitized solar cells (DSSCs).[62] Hau, et al. utilized carboxylate-anchored $C_{60}$ SAMs as electron acceptors in inverted (substrate/cathode/PAL/anode) BHJ OPVs with great success, achieving over 4% PCE, and demonstrating that $C_{60}$ without the aid of an electron acceptor functions well as an ETL/HBL IFL.[63] Matsuo, et al. fabricated similar SAM structures on ITO with three or four carboxylate anchors instead of one. With the device structure substrate/ITO/($C_{60}$ or $C_{70}$), photodiodes were successfully fabricated, though OPVs were not.[64] Cho, et al. constructed OPVs where an ITO-anchored dyad (Si—$C_{60}$—ZnPor) functioned as the PAL, and where ITO was the cathode and Pt was the anode. Device performance was not reported, but peak quantum efficiency for the blue-absorbing system was estimated to be as high as 19%.[65] These examples demonstrate the significant absorptivity, photoactivity, and charge-transferring capabilities of surface-anchored fullerenes and dyads, and strongly support the ideas presented in this proposal, namely the application of dyads as photoswitched IFLs. The use of photoactive dyad SAMs in conjunction with BHJ PALS, as described in the present invention has not been previously reported.

From the preceding discussion the inventors hypothesize that by varying the structure and electronic properties of the donor D and of the acceptor A as well as the length and electronic properties of the linker (y), it is possible to control the efficiencies and stabilities (lifetimes) of photoinduced intramolecular charge transfer states ($D^+$-y-$A^-$). The present invention describes a series of dyads containing anchoring groups (x) that can easily and efficiently attach the compounds to selected electrode surfaces, both anodes [typically ITO, Al:ZnO (AZO) or F:$SnO_2$ (FTO)] and cathodes (typically gold, silver, or aluminum). For EB/HT layers the compounds will have the anchoring groups attached to the donor (x-D-y-A) while the reverse will be true for HBL/ETL layers (x-A-y-D). When properly anchored to an electrode surface, these compounds exhibit a polarizing effect even in their ground states, as described above. However, when photoexcited and promoted to the $S_1$ excited state, such donor-acceptor structures will yield the desired zwitterionic states as described above for dyads in solution,[26] and as illustrated in FIG. 1A. FIG. 1A is a schematic showing the structure of the anode photo-switching fullerene-based dyad 100 (-x-D-y-A) IFL material. The -x-D-y-A IFL material 104 attached to the anode electrode surface 102 via an anchor 106. The IFL material 104 in addition to the anchor 106, further comprises a donor 108, a linker 110, and an acceptor 112. The cathode design is D-y-A-x to reverse the polarity.

A schematic example of an EB/HT SAM 150 is shown in FIG. 1B, with an anchoring —$SiCl_3$ group (x) 154 strategically attached to a Por donor (D) 156, while D is covalently attached to a fulleropyrrolidine acceptor 158. The inventors use Pors and TPAs as donors in the present invention, however it is possible to incorporate other donors in the future, such as Pcs.[40-42] The donors will also be covalently connected to electron acceptors using a variety of linkers (y) that will range from simple alkyl or aryl groups to more specialized ones like the p-cyclophane already described above and published recently by the present inventors.[61] In all cases, the A groups will be fullerenes, ranging from $C_{60}$ to the endohedral TMN fullerenes with unique electronic properties.[61] The final structures, x-D-y-A as well as the inverse ones, x-A-y-D, will be fully characterized and evaluated as EBL/HTL and HBL/ETL IFLs by a suite of electrical, spectroscopic, spectrometric, photonic, and surface techniques, and in practice in OPVs. Upon illumination, intramolecular electron transfer should result in zwitterionic and thus highly polarized SAMs that will function in a three-fold capacity: 1) as strongly EBL/HTL or HBL/ETL layers to improve device rectification, 2) as charge-depletion regions to influence charge diffusion, and 3) as polarizers of the device to increase charge carrier drift velocity to further improve charge collection from the interior of the photoactive layer.

It is important to note that SAMs based on ground-state zwitterionic compounds could in principle be prepared directly without the need for the photoswitching stimulus, but SAM formation in those cases would be inhibited considerably by charge repulsion, since equal charges would have to be self-assembled in adjacent positions in close proximity for the correct molecular orientation to be achieved. This would be electrostatically very unfavorable. It is thus more feasible and advantageous to self-assemble neutral compounds which can be photoswitched into zwitterionic states by intramolecular electron transfer after SAM formation. In addition, ground-state zwitterionic compounds are typically not easy to reduce or oxidize since electrons are relatively strongly bound, thus lacking the ability to conduct charge carriers, a desired property for enhanced charge diffusion. All of these observations dictate the need to prepare IFLs based on compounds that are initially polarized but intrinsically neutral until photoirradiated, as the ones proposed in the present invention. These compounds should also adhere to the IFL guidelines as stated previously.

Case I

Design and Syntheses of Compounds for EB/HT IFLs (x-D-y-A)

All compounds designed for IFL SAM formation contain a fullerene as the acceptor group but two different donor types will be initially prepared; Por or TPA. The present inventors have previously synthesized and characterized a wide variety of D-y-A dyads, as well as the addition of anchoring groups, x, to aromatic substituents.

Por-based Dyads for Self-assembly on ITO and Other TCEs: The synthetic scheme for the preparation of a prototype Por-fullerene-based dyad is shown in FIG. 2A. The desired 5,15-substituted porphyrin 3 will be obtained by linking benzaldehydes 1 and 2 with the commercially available 2,2'-dipyrromethane.[66] Coupling of ethyl glyoxylate with amine 3, and further reduction of the resulting imine with 1,4-cyclohexadiene will afford glycine 4. A 1,3-dipolar cycloaddition reaction, using glycine 4, $C_{60}$, and paraformaldehyde in refluxing o-DCB should yield an N-phenylporphyrinfulleropyrrolidine intermediate.[67] After treatment of this intermediate with $Zn(OAc)_2$ the N-phenylmetalloporphyrinfulleropyrrolidine 5 should be obtained. Hydrosilation of the vinyl group with Speier's catalyst should afford organosilane 6.[68]

Figure 2B:
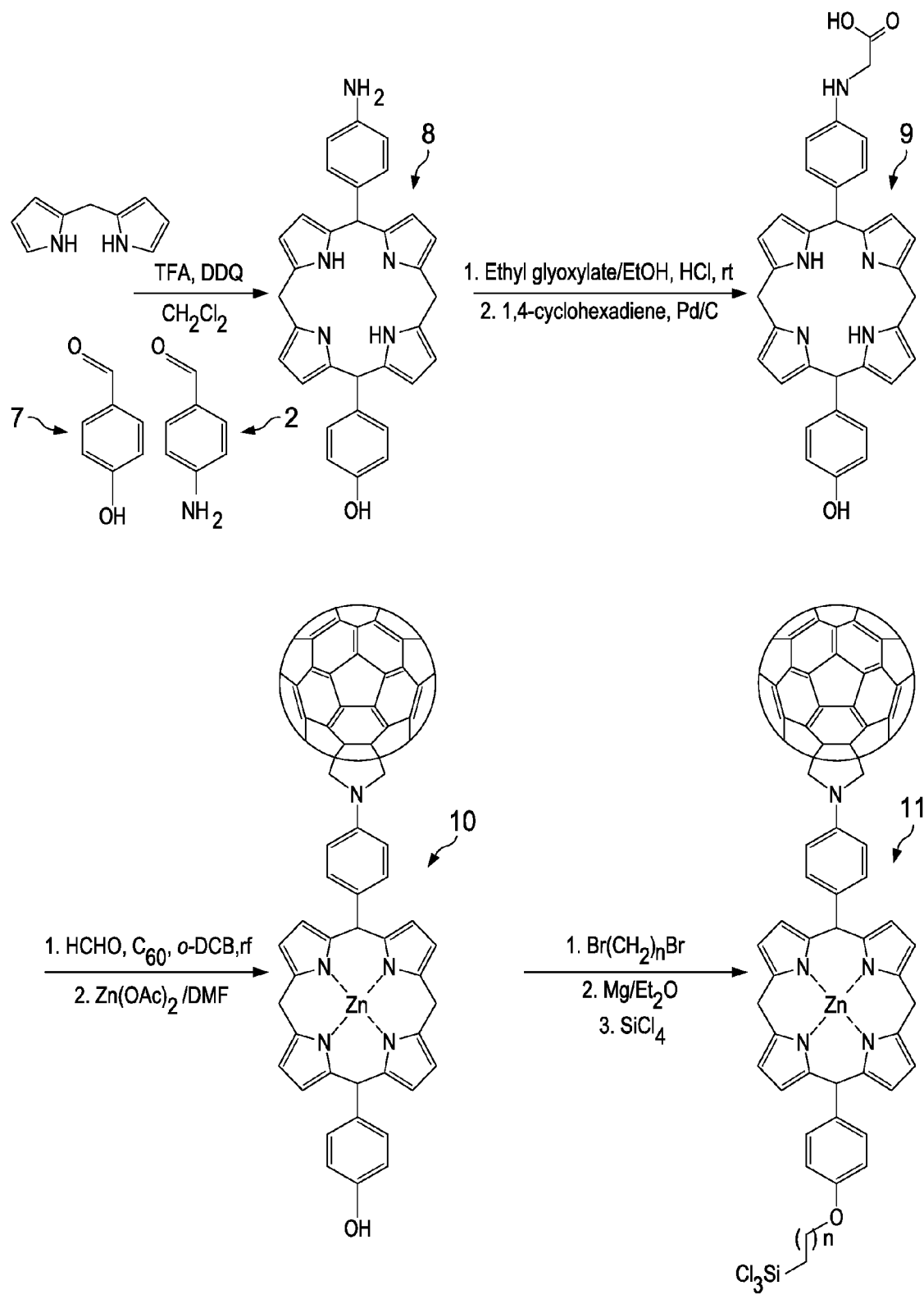
Figure 2C:
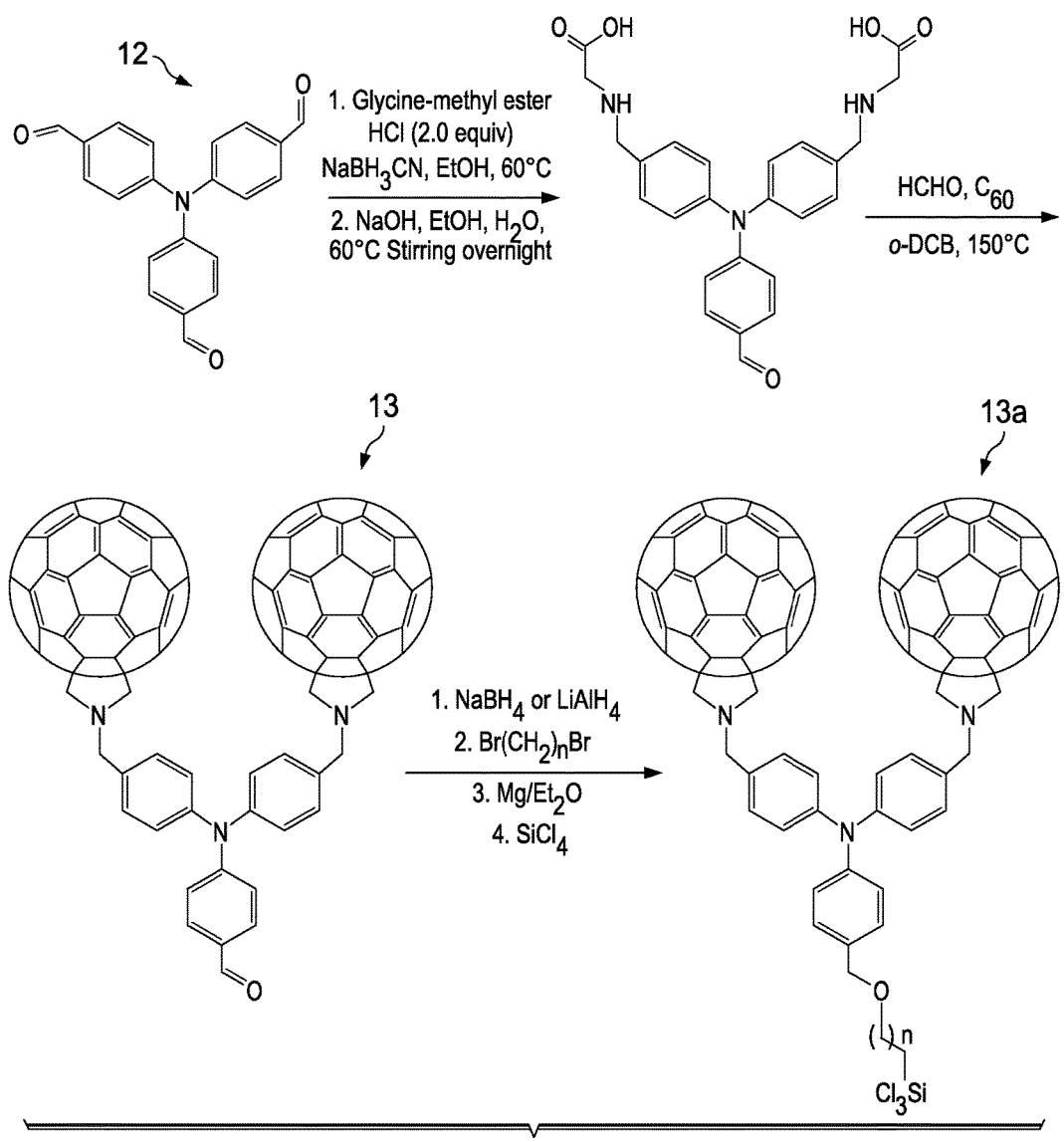

As an alternate anchor for the ITO electrode, a trichloro (phenoxy)silane group can be obtained using 4-(hydroxymethyl)benzaldehyde 7. The synthetic pathway from intermediate 8 to 10 will be the same as in FIG. 2A. An etherification reaction between phenol 10 and $Br(CH_2)_nBr$,[69-70] followed by treatment with Mg in ether will afford a Grignard intermediate (FIG. 2B). Coupling of the Grignard intermediate with $SiCl_4$ will yield the desired 5-phenylfulleropyrrolidine-15-trichloro(phenoxy)silane zinc porphyrin 11.[71] Using this approach, control over the chain length of the anchor can be accomplished. TPA-based Dyads for Self-assembly on ITO and other TCEs: For the synthesis of TPA-based D-A conjugates we will pursue the strategy of preparing fulleropyrrolidines with a donor group directly connected to the nitrogen atom of the pyrrolidine ring as depicted in FIG. 2C.[72-73] These linkages have been previously shown by the present inventors to be much more stable upon photoirradiation than the corresponding C-attached dyads, in which the groups are covalently attached to pyrrolidine α-carbons.[60] It must be noted that compound 13 contains two fullerene donors, but in FIG. 2D the inventors present a TPA dyad that contains only one fullerene.

A two-step synthesis is involved in the preparation of N,N-bis(4-phenylglycine)aminobenzaldehyde 12.[60] The preparation of 12 will be achieved by treating tris-(4-formylphenyl)-amine with glycine-methyl ester to obtain an ether intermediate that will be hydrolyzed to the corresponding carboxylic groups to obtain the desired glycines. A 1,3-dipolar cycloaddition reaction between glycine 12, paraformaldehyde and $C_{60}$ will yield N,N'-bis(fulleropyrrolidine) aminobenzaldehyde 13. A similar etherification reaction as described in FIG. 2B was employed to build the —$SiCl_3$ anchor after treatment of the resulting Grignard reagent with $SiCl_4$ to yield 13a.

Figure 2D:
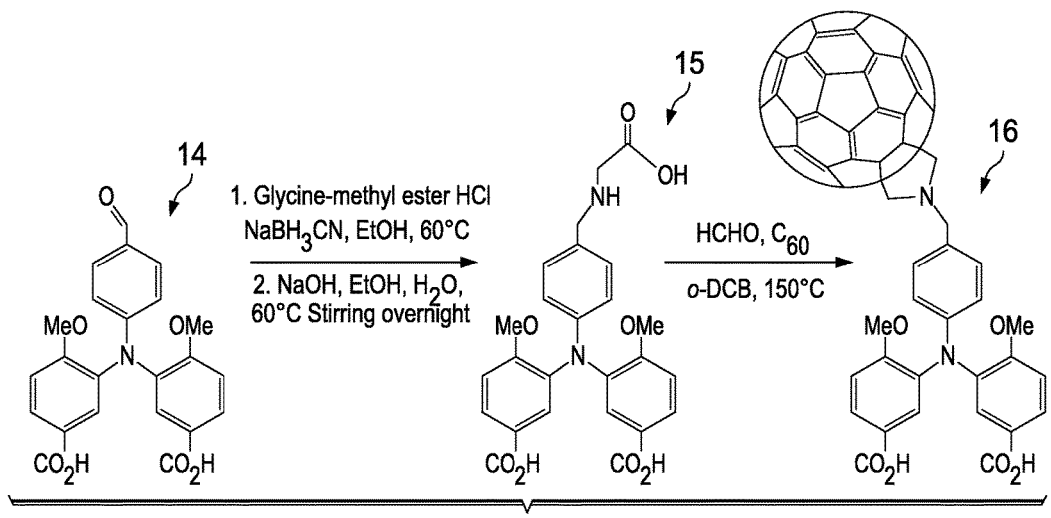

The preparation of compounds 15 and 16 will follow a strategy similar to those of compounds 12 and 13, see FIG. 2D. However, in this reaction N, N'-bis(4-methoxybenzoicacid) aminobenzaldehye 14 and glycine-methyl ester was used as the precursors for the preparation of N, N'-bis(4-methoxybenzoic acid) amino phenylglycine 15. N—N'-bis(4-methoxybenzoic acid) fulleropyrrolidine 16 was prepared by a 1,3-dipolar cycloaddition reaction to between $C_{60}$ and 15 in refluxing o-DCB. Lastly, the two carboxylic groups in compounds 16 were reduced to the corresponding primary alcohols and surface anchors added as described in FIG. 2B, to provide a double-anchoring motif for the ITO surface.

Although of all of the compounds presented thus far contain a —$SiCl_3$ [or alternatively —$Si(OR_3)$] group as the anchor to form SAMs on ITO via siloxane formation, other anchoring groups can also be considered. Some additional possibilities include: 1) —$CO_2^-$, which can attach non-covalently although the resulting physisorbed SAMs are not as robust, and 2) -Ph-$N_2$, which can be attached covalently via direct electrochemical reduction.[74]

Case II
Design and Syntheses of Compounds for HBL/ETL IFLs (x-A-y-D)

The compounds designed in this section also contain Por and TPA donors and fullerene acceptors but the latter are the ones that possess the anchoring groups to self-assemble on the metal cathodes. This is the opposite relative orientation of the x-D-y-A dyads on the solid surfaces, so that upon photoexcitation the positive charge will be oriented towards the PAL. Since thiol attachment to gold and silver electrodes is a very well established field and the present inventors have designed all of the compounds to contain thiol groups as the anchoring motifs, x.

Figure 2E:
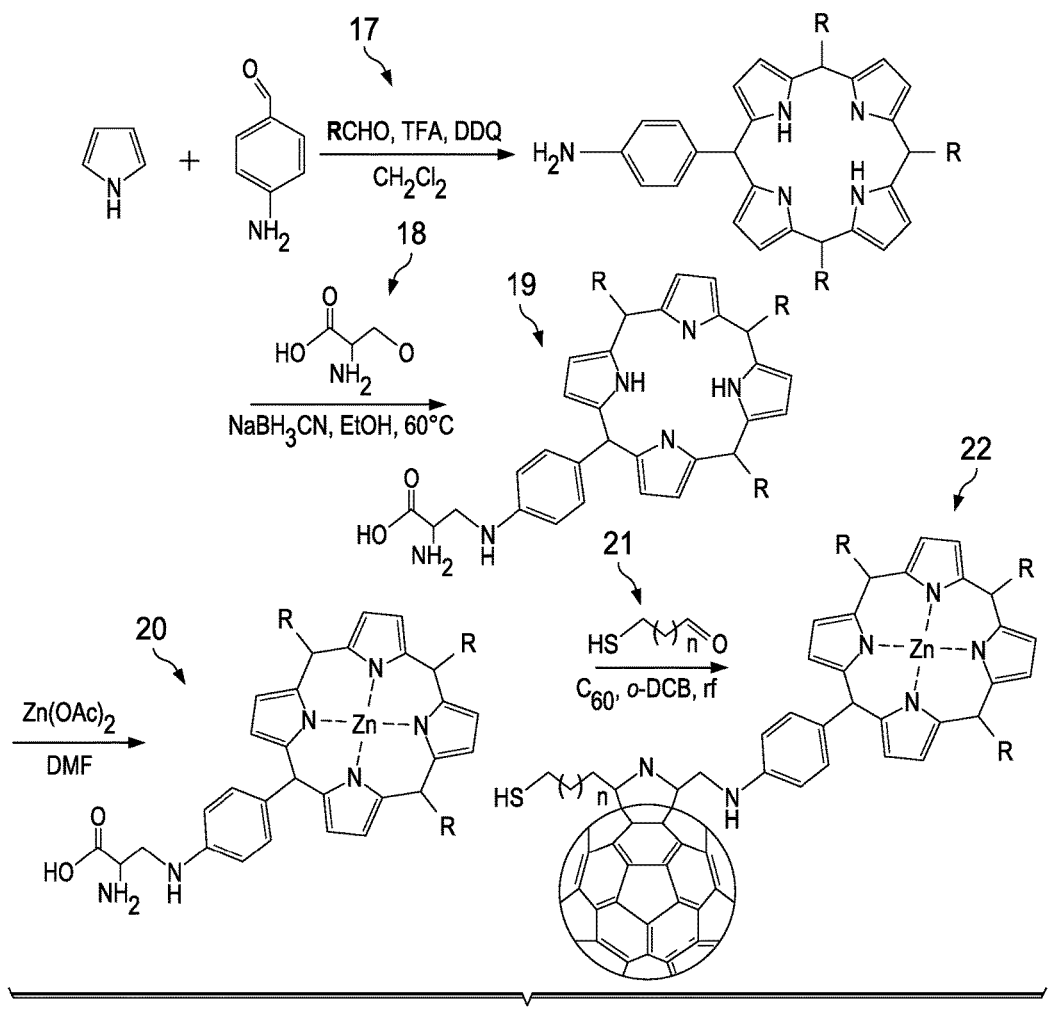

Por-based Dyads for Self-assembly on Ag or Au Electrodes: FIG. 2E shows a relatively simple synthetic scheme that yielded compounds with the desired structural motifs, with a Por donor and a fullerene acceptor and the ability to self-assemble on a metal electrode. The elaboration of porphyrin 17 from pyrrol and 4-aminobenzaldehyde, 2, in $CH_2Cl_2$ will afford a mixture of isomers including the desired 17. Coupling of the amine group in 17 with aldehyde 18 will afford the desired porphyrin glycine 19. Treatment of intermediate 19 with $Zn(OAc)_2$ will afford zinc-porphyrin 20. A 1,3-dipolar cycloaddition reaction, between glycine 20, $C_{60}$, and mercapto alkyl aldehyde 21 in refluxing o-DCB will yield 2-mercapto-2'-zinc porphyrin fulleropyrrolidine dyad 22.[67]

Figure 2F:
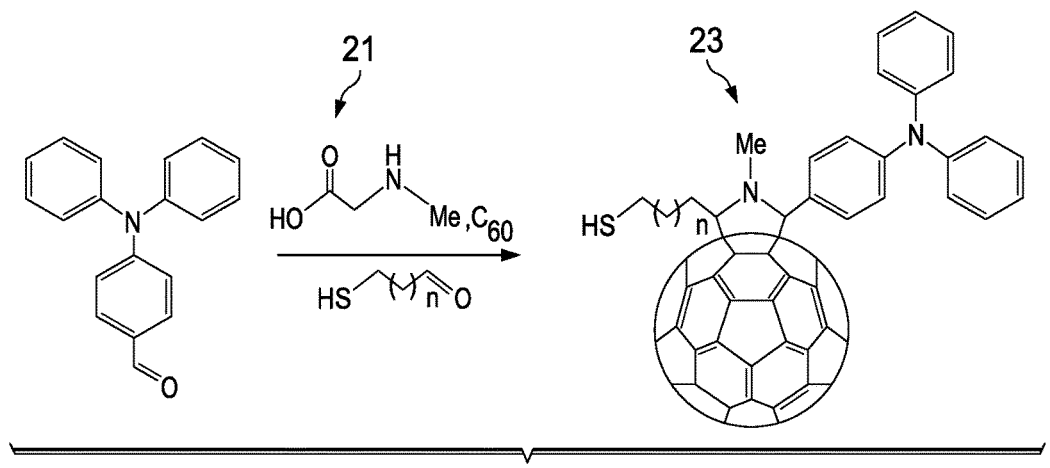

TPA-based Dyads for Self-assembly on Ag or Au Electrodes: The one-step synthetic methodology for thiol functionalized fullerene-triphenylamine dyad 23 involves a general procedure developed by Maggini et al.[67] for fulleropyrrolidine synthesis and Hoang et al.[75] for fullerene-ferrocenes. This donor-acceptor type dyad can be prepared by the reaction of $C_{60}$ in the presence of Sarcosine, and a mercapto alkyl aldehyde 21 (the number of carbons is variable) in toluene followed by chromatographic purification over silica gel column, as shown in FIG. 2F.

Characterization of the Charge Separated States of the Dyads in Solution: Once prepared, purified and structurally characterized in solution (NMR, UV-vis, Raman, and FTIR), the dyad compounds were studied in solution photophysically. Time-resolved spectrofluorometric measurements determined the lifetimes of the photochemically induced intramolecular charge separated states (x-$D^+$-y-$A^-$ and x-$A^-$-y-$D^+$). The measurements were performed using a Spectrofluorometer. Fast kinetic spectroscopic studies were used to characterize excited states, including their optical spectra, lifetimes, quantum yields, and energies. Additionally, pulse radiolysis was used to generate and characterize excited triplet states in non-aqueous media such as toluene or benzene containing 0.02 M biphenyl. This technique provides an elegant way of forming excited triplet states by bypassing the initial singlet excited state. These techniques allow direct identification and characterization of transient species, such as short-lived reactive intermediates and stable products that show differential absorption changes in the range between 400 and 1600 nm.

Characterization of the Dyads as SAMs: While solution characterization helps understand structure-property correlations, guide future synthetic developments to optimize compound stabilities, and to improve charge separation efficiencies, surface immobilization and subsequent characterization of the compounds are of fundamental importance in the present invention. SAM structures containing D-A pairs have been previously prepared on electrodes and tested for photo-response successfully,[62,65] however no precedent exists for their use as IFLs in OPVs. In order to fully characterize the SAMs and the devices proposed herein, a multiple technique characterization approach will be necessary. SAMs were characterized (AM1.5G-illuminated and in the dark, where appropriate) via electrochemistry,[77] impedance spectroscopy,[78-80] scanning probe microscopy (SPM: AFM, cAFM, SCM, SKPM)[6,12,81-82] ultraviolet/x-ray photoelectron microscopy (UPS/XPS),[6,12] MALDI mass spectrometry, spectrophotometry, spectrofluorometry, confocal Raman spectroscopy, and grazing-angle attenuated FT-IR spectroscopy.

a) Electrochemical Techniques: x-D-y-A dyads with —$SiCl_3$ or —$Si(OR_3)$ anchors were self-assembled on pre-treated ITO electrodes following a very similar protocol to that described by Marks et. al. for the preparation of ferrocene-containing SAMs.[77] These inventors reported the synthesis of Fc-$(CH_2)_4$—$SiCl_3$ and showed that a saturated, densely-packed monolayer was obtained on commercial ITO substrates after exposure for 9 h, yielding a full coverage of $6.6 \times 10^{-10}$ mol/$cm^2$. This value was determined using a combination of cyclic voltammetry (CV) and synchrotron X-ray reflectivity (XRR).[77] SAM preparation followed similar procedures to those reported by Marks et. al., including the pre-treatment of the ITO electrodes.[77]

The x-A-y-D dyads with thiol anchor groups for HBL/ETL SAMs on Au or Ag were prepared following literature procedures, including those previously described by the inventors.[78-80,83-86] The ITO-, Au-, and Ag-anchored SAMs will be initially characterized using CV, and studies were designed to observe the electrochemical responses upon AM1.5G illumination. Ion binding can be directly monitored by CV measurements but only if electroactive groups are close enough to the cation binding site to be sufficiently affected by the extra charge acquired upon binding.[87] When there are no electroactive groups directly attached that can be monitored directly by CV upon charge generation, it is possible, and to some degree it is more convenient, to monitor the impedance, as described below.[78-80,83-86]

Figure 3:
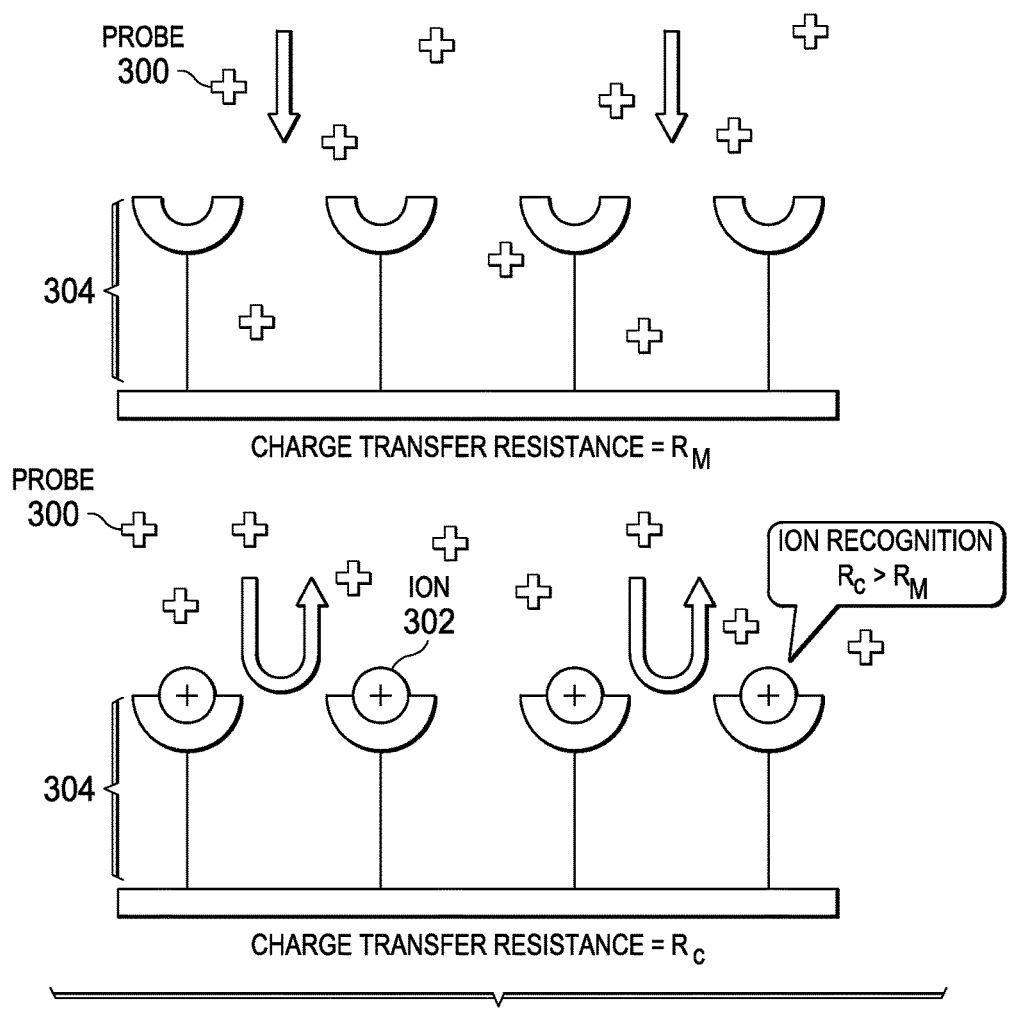
FIG. 3 is a diagram depicting why RCT for probe ion increases upon ion binding, due to surface charge buildup.

The concept behind the impedance measurements is represented in FIG. 3. A solution redox probe cation (red crosses in FIG. 3) bearing the same charge as the analyzed cation (blue crosses) is used to measure the impedance of the system, specifically extracting the charge transfer resistance ($R_{CT}$) directly from the complex impedance plots or from data fits to the equivalent circuit.[78] Upon ion binding by the SAM (304), $R_{CT}$ increases because the increased positive surface charge rejects the probe ions 300, as depicted schematically in FIG. 3. The $R_{CT}$ increases are linearly related to the concentration of the analyte, thus making these SAMs (304) excellent and convenient selective ion sensors. $Ru(NH_3)_6^{3+/2+}$ is a convenient redox couple probe because its CV response is reversible on a bare gold electrode but irreversible on SAMs, especially when these are positively charged. Since the HBL/ETL ILs described herein also generates surface positive charges upon photoexcitation (Au—S-A$^-$-y-D$^+$) the inventors use impedance spectroscopy, with $Ru(NH_3)_6^{3+/2+}$ as the probe ion. These measurements were made in the absence and in the presence of light to establish the photoexcitation effect on the impedance and later on extended to quantify the effect of the light intensity on the measured values.

To probe the effects of illumination on the EBL/HTL SAMs on ITO the inventors used impedance spectroscopy, but using a negatively charged probe ion, such as the $Fe(CN)_6^{3-/4-}$ redox couple. The concept is exactly the same as that presented in FIG. 3 except that the surface will be negatively charged, thus the negative probe ions will be repelled and $R_{CT}$ will increase. The inventors thus prepared the SAMs on ITO electrodes as already described and monitored their CV and impedance spectroscopy as a function of illumination. Any observed changes will indicate that surface charge is being generated as desired.

b) Scanning Probe Microscopy: To achieve atomically-resolved spatial analysis of the SAMs fabricated here, SPM techniques were employed. Each technique is described in detail below, but spatial information is of great importance in identifying layer inhomogeneities, for example, incomplete surface SAM coverage[77] and charge traps.[89] Atomic force microscopy (AFM) will map the SAM-coated substrate surface topographically and show any phase changes. A properly fabricated SAM should reflect the surface roughness of the under-lying substrate; however, a SAM exhibiting incomplete coverage will be evidenced by inconsistent height variations (and therefore RMS roughness) and notable phase changes as the SPM tip travels from elastic organic to inelastic inorganic surfaces. Conductive AFM (cAFM) measures surface current in parallel with AFM. Resulting current maps will show any hot and dead spots due to inhomogeneously grown SAMs, and yield IFL resistance data by Ohm's law. Irwin, et al. demonstrated cAFM imaging as a viable technique to quantify the homogenizing effect of ITO HCl treatment[6] and NiO on ITO[12]. In addition to the former techniques, cAFM will image resistance changes due to electrode poling under AM1.5G illumination—demonstrating the desired photoswitching effect. Imaging in reverse and forward bias over a range of applied voltages will confirm the direction of the SAM dipole, and evidence the fabricated SAM's charge-blocking capabilities.

Scanning capacitance microscopy (SCM) is complimentary to cAFM in that it will show variations in capacitance due to SAM coverage. It was particularly important to observe if changes in capacitance occur under illumination, likely due to an increase in the SAM dipole moment.

c) Photoelectron Spectroscopy and Mass Spectrometry: XPS and MALDI of SAM-coated substrates provide elemental and structural data, and UPS was used to determine the substrate work function (to be cross-referenced with SKPM data).

d) Photometric and FT-IR Analysis: Essential SAM analysis included UV-Vis and time-resolved luminescence spectrophotometry (TR-LS). UV-Vis measured % transmittance, and TR-LS provided SAM excitation and luminescence spectra, as well as photoexcited state lifetimes.

Confocal Raman microscopy and grazing-angle attenuated FT-IR provided structural data via functional group identification and evidence of electronic anisotropy upon photoexcitation. Reflection Absorption Infrared Spectroscopy (RAIRS) established the degree of organization and structure of the SAMs.

Device Fabrication and PCE Evaluation: As each new SAM was developed, refined, and characterized, the materials were tested in BHJ OPVs with an architecture "substrate/anode/IFL/PAL/IFL/cathode".[3-6,91-93] It is important to note that device fabrication and testing is not necessarily an end in itself but is an additional technique to evaluate the ultimate effectiveness of the proposed photoswitched IFLs. Thus, device preparation and testing, although normally seen as an "applied" endeavor, is really envisioned here as an additional technique to probe the fundamental properties of the SAMs. A detailed cell characterization combined with a complete investigation of the kinetics and light to energy conversion performances, that is, electron injection, recombination, etc. was carried out using photocurrent measurements, as well as by steady-state and time-resolved techniques with the modified photoelectrodes. OPVs were fabricated to test the SAM IFLs with the common donor materials P3HT,[22] PTB7[94] and PCPDTBT,[95] and PCBM-type[96] fullerene acceptors to evaluate performance. Device performance will be considered relative to the HOMO and LUMO energies of the PAL materials. Each device underwent I-V characterization under AM1.5G illumination and in the dark, as well as internal and external quantum efficiency analysis. OPV designs that reach the latter stage of optimization were subjected to long-term radiation and thermal stressing to determine their durability. All device performance parameters were reported relative to a co-fabricated set of control devices of the structure substrate/ITO/IFL/PAL/LiF/cathode (cathode=Al, Ag, or Au, as appropriate). The control IFLs will be PEDOT:PSS and HCl-treated ITO.[6]

OPVs containing SAMs were fabricated in three different architectures: standard, inverted and sandwich. Fabrication methods are described herein below.

Standard: ITO-on-glass substrates are cleaned by a standard solvent system (sonication in warm water/detergent, DI water, MeOH, and acetone, respectively), and then reactive ion etching (RIE) oxygen plasma. SAM (EB/HT) formation is either through soaking, spin-coating, or vapor depositing (material dependent) from solutions of SAM precursors on the clean ITO substrates. This is followed by spin-coating of the PAL solution (o-dichlorobenzene or similar). The PAL is allowed to slowly dry in a closed volume and then annealed. The dry substrates are loaded into a high vacuum thermal evaporation chamber where LiF and Al are deposited, subsequently, to complete the OPVs.

Inverted: ITO substrates are prepared as above, except with HBL/ETL SAMs, followed by spin-coated layer of PAL, and PEDOT:PSS spin-coated from an alcohol solution. The devices are completed with vapor-deposited Au cathodes.[97]

Figure 4:
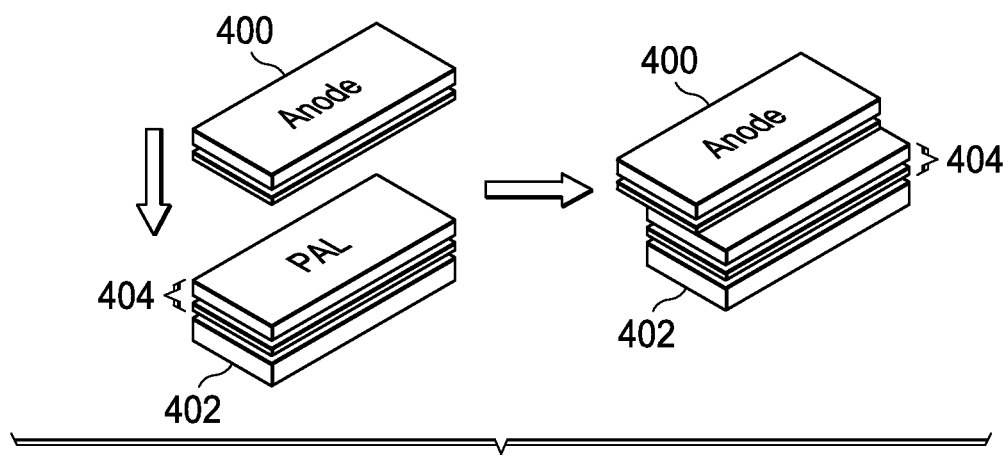
FIG. 4 is a schematic of the sandwich OPV device design. Metal cathodes (grey) are coated with HBL/ETL SAMs (blue), followed by spin-coated PAL. While still wet, anodes (silver) with EB/HT SAMs (red) are placed on the PAL and allowed to dry. The electrodes are off-set as in DSSCs to allow for electrical contact.

Sandwich: Following dye-sensitized solar cell (DSSC) design,[98] each electrode (400 and 402) was prepared individually, and then "sandwiched" together with the PAL (404) acting as the adhesive. Float-glass substrates were cleaned by the solvent system described hereinabove, followed by treatment in a UV-ozone reactor. The clean glass substrates was coated with Ag thin films by thermal evaporation, onto which HBL/ETL SAMs were grown. These are the cathodes (402). The anodes (400) are HCl-treated ITO substrates and also ITO with EB/HT SAMs.[6] In this manner the inventors were able to prepare photoswitched ILs on both the anode and the cathode, and these were used to sandwich the PAL (404), which acts as the adhesive. On the cathodes (402), the PAL (404) were deposited by spin-coating, and, while still wet, the freshly prepared anodes (400) were set atop the PAL (404), as illustrated in FIG. 4. Once dry, the PAL (404) adhered the two substrates together. If adhesion was not significant, a hot press can also be employed. To further improve the mechanical robustness of this design, the final sandwich is encapsulated in Parylene (a vapor deposition process[99]), by liquid epoxy, or by spray enamel.

Irwin et al. have demonstrated previously that when PEDOT:PSS was removed from the P3HT:PCBM BHJ OPV and replaced with p-type NiO, modest increases in $V_{oc}$, fill factor (FF) and short-circuit current density ($J_{sc}$) were observed, resulting in a PCE increase from ~4% to ~5%. With the SAM design of the present invention, even greater improvements in $V_{oc}$ are expected. Theoretical $V_{oc}$ of a OPV device design is defined as the difference in energy between $HOMO_{donor}$ and $LUMO_{acceptor}$, and for a P3HT:PCBM OPV this is ~1.0 V ($HOMO_{P3HT}$≈5.0 eV, $LUMO_{PCBM}$≈4.0 eV). Typically, the observed $V_{oc}$ is ~600 mV resulting in a ~400 mV potential loss. This loss is believed to be the result of diode leakage and the consequential reverse diodes that are formed due to ineffective IFLs.[1,5] When strongly polarized IFLs, as described herein, are introduced into BHJ OPVs, IFL function increases dramatically due to like-charge repulsion. The consequence of this scenario is a significant increase in $V_{oc}$, yielding up to 50% PCE increases versus the control devices (600 mV→900 mV, $PCE=V_{oc}FFJ_{sc}/P_o$ where $P_o$=incident radiation power density). To conclude, photoswitched IFLs could yield P3HT:PCBM devices as high as PCE=6.5%, under ideal conditions. In lieu of P3HT:PCBM, state-of-the-art PAL materials, such as endohedral fullerenes, PTB7, and PCP-DTBT could yield significantly higher PCEs.

It is contemplated that any embodiment discussed in this specification can be implemented with respect to any method, kit, reagent, or composition of the invention, and vice versa. Furthermore, compositions of the invention can be used to achieve methods of the invention.

It may be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it may be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

U.S. Pat. No. 7,799,990: Electron-Blocking Layer/Hole-Transport Layer for Organic Photovoltaics and Applications of Same.
U.S. Patent Application Publication No. 2009/0044855: p-Type Semiconducting Nickel Oxide as an Efficiency-Enhancing Anodal Interfacial Layer in Bulk Heterojunction Solar Cells.
WIPO Patent Application WO/2010/059240: Doped Interfacial Modification Layers for Stability Enhancement for Bulk Heterojunction Organic Solar Cells.
(1) Moliton, A.; Nunzi, J.-M. "How to model the behavior of organic photovoltaic cells" Polymer International 2006, 55, 583.
(2) Pivrikas, A.; Sariciftci, N. S.; Juska, G.; Osterbacka, R. "A review of charge transport and recombination in polymer/fullerene organic solar cells" Prog. Photovoltaics Res. Appl. 2007, 15, 677.
(3) Hains, A. W.; Liu, J.; Martinson, A. B. F.; Irwin, M. D.; Marks, T. J. "Anode Interfacial Tuning via Electron-Blocking/Hole-Transport Layers and Indium Tin Oxide Surface Treatment in Bulk-Heterojunction Photovoltaic Cells" Advanced Functional Materials 2010, 20, 595.
(4) Hains, A. W.; Ramanan, C.; Irwin, M. D.; Liu, J.; Wasielewski, M. R.; Marks, T. J. "Designed Bithiophene-Based Interfacial Layer for High-Efficiency Bulk-Heterojunction Organic Photovoltaic Cells: Importance of Interfacial Energy Level Matching" ACS Appl. Mater. Interfaces 2010, 2, 175.
(5) Irwin, M. D.; Buchholz, D. B.; Hains, A. W.; Chang, R. P. H.; Marks, T. J. "p-Type semiconducting nickel oxide as an efficiency-enhancing anode interfacial layer in polymer bulk-heterojunction solar cells" Proc. Natl. Acad. Sci. U.S.A. 2008, 105, 2783.
(6) Irwin, M. D.; Liu, J.; Leever, B. J.; Servaites, J. D.; Hersam, M. C.; Durstock, M. F.; Marks, T. J. "Consequences of Anode Interfacial Layer Deletion. HCl-Treated ITO in P3HT:PCBM-Based Bulk-Heterojunction Organic Photovoltaic Devices" Langmuir 2010, 26, 2584.
(7) Li, G.; Shrotriya, V.; Huang, J.; Yao, Y.; Moriarty, T.; Emery, K.; Yang, Y. "High-efficiency solution processable polymer photovoltaic cells by self-organization of polymer blends" Nature Materials 2005, 4, 864.
(8) Lee, J. H.; Cho, S.; Roy, A.; Jung, H.-T.; Heeger, A. J. "Enhanced diode characteristics of organic solar cells using titanium suboxide electron transport layer" Applied Physics Letters 2010, 96, 163303/1.
(9) Seo, J. H.; Gutacker, A.; Sun, Y.; Wu, H.; Huang, F.; Cao, Y.; Scherf, U.; Heeger, A. J.; Bazan, G. C. "Improved High-Efficiency Organic Solar Cells via Incorporation of a Conjugated Polyelectrolyte Interlayer" Journal of the American Chemical Society 2011, 133, 8416.
(10) Li, N.; Lassiter, B. E.; Lunt, R. R.; Wei, G.; Forrest, S. R. "Open-circuit voltage enhancement due to reduced dark current in small molecule photovoltaic cells" Applied Physics Letters 2009, 94, 023307/1.
(11) Heidel, T. D.; Hochbaum, D.; Sussman, J. M.; Singh, V.; Bahlke, M. E.; Hiromi, I.; Lee, J.; Baldo, M. A. "Reducing recombination losses in planar organic photovoltaic cells using multiple step charge separation" Journal of Applied Physics, No pp. yet given.
(12) Irwin, M. D.; Servaites, J. D.; Buchholz, D. B.; Leever, B. J.; Liu, J.; Emery, J. D.; Zhang, M.; Song, J.-H.; Durstock, M. F.; Freeman, A. J.; Bedzyk, M. J.; Hersam, M. C.; Chang, R. P. H.; Ratner, M. A.; Marks, T. J. "Structural and Electrical Functionality of NiO Interfacial Films in Bulk Heterojunction Organic Solar Cells" Chemistry of Materials 2011, ASAP.
(13) Kemerink, M.; Timpanaro, S.; De Kok, M. M.; Meulenkamp, E. A.; Touwslager, F. J. "Three-Dimensional Inhomogeneities in PEDOT:PSS Films" J. Phys. Chem. B 2004, 108, 18820.
(14) Brumbach, M.; Veneman, P. A.; Marrikar, F. S.; Schulmeyer, T.; Simmonds, A.; Xia, W.; Lee, P.; Armstrong, N. R. "Surface Composition and Electrical and Electrochemical Properties of Freshly Deposited and Acid-Etched Indium Tin Oxide Electrodes" Langmuir 2007, 23, 11089.
(15) Pingree, L. S. C.; MacLeod, B. A.; Ginger, D. S. "The changing face of PEDOT:PSS films: substrate, bias, and processing effects on vertical charge transport" J. Phys. Chem. C 2008, 112, 7922.
(16) Girtan, M.; Rusu, M. "Role of ITO and PEDOT:PSS in stability/degradation of polymer: fullerene bulk heterojunctions solar cells" Sol. Energy Mater. Sol. Cells 2010, 94, 446.
(17) Jorgensen, M.; Norman, K.; Krebs, F. C. "Stability/degradation of polymer solar cells" Sol. Energy Mater. Sol. Cells 2008, 92, 686.
(18) Betancur, R.; Maymo, M.; Elias, X.; Vuong, L. T.; Martorell, J. "Sputtered NiO as electron blocking layer in P3HT:PCBM solar cells fabricated in ambient air" Sol. Energy Mater. Sol. Cells 2011, 95, 735.
(19) Li, C. N.; Kwong, C. Y.; Djurisic, A. B.; Lai, P. T.; Chui, P. C.; Chan, W. K.; Liu, S. Y. "Improved performance of OLEDs with ITO surface treatments" Thin Solid Films 2005, 477, 57.
(20) Li, J.; Marks, T. J. "Air-Stable, Cross-Linkable, Hole-Injecting/Transporting Interlayers for Improved Charge Injection in Organic Light-Emitting Diodes" Chem. Mater. 2008, 20, 4873.
(21) Ahlswede, E.; Hanisch, J.; Powalla, M. "Comparative study of the influence of LiF, NaF, and KF on the performance of polymer bulk heterojunction solar cells" Appl. Phys. Lett. 2007, 90, 163504/1.
(22) Li, G.; Shrotriya, V.; Yao, Y.; Yang, Y. "Investigation of annealing effects and film thickness dependence of polymer solar cells based on poly(3-hexylthiophene)" J. Appl. Phys. 2005, 98, 043704/1.
(23) Kim, J. Y.; Kim, S. H.; Lee, H.-H.; Lee, K.; Ma, W.; Gong, X.; Heeger, A. J. "New architecture for high-efficiency polymer photovoltaic cells using solution-based titanium oxide as an optical spacer" Adv. Mater. (Weinheim, Ger.) 2006, 18, 572.
(24) Kim, J. S.; Park, J. H.; Lee, J. H.; Jo, J.; Kim, D.-Y.; Cho, K. "Control of the electrode work function and active layer morphology via surface modification of indium tin oxide for high efficiency organic photovoltaics" Appl. Phys. Lett. 2007, 91, 112111/1.
(25) Beaumont, N.; Hancox, I.; Sullivan, P.; Hatton, R. A.; Jones, T. S. "Increased efficiency in small molecule organic photovoltaic cells through electrode modification with self-assembled monolayers" Energy Environ. Sci. 2011, 4, 1708.
(26) Migita, M.; Okada, T.; Magata, N.; Nishitani, S.; Kurata, N.; Sakata, Y.; Misumi, S. "Picosecond time-resolved observation of photoinduced charge separation from the singlet excited state of porphyrin-quinone model systems" Chem. Phys. Lett. 1981, 84, 263.
(27) Imahori, H. "Creation of Fullerene-Based Artificial Photosynthetic Systems" Bull. Chem. Soc. Jpn. 2007, 80, 621.
(28) Allemand, P. M.; Koch, A.; Wudl, F.; Rubin, Y.; Diederich, F.; Alvarez, M. M.; Anz, S. J.; Whetten, R. L. "Two different fullerenes have the same cyclic voltammetry" J. Am. Chem. Soc. 1991, 113, 1050.
(29) Xie, Q.; Perez-Cordero, E.; Echegoyen, L. "Electrochemical detection of C606- and C706-: Enhanced stability of fullerides in solution" Journal of the American Chemical Society 1992, 114, 3978.
(30) Imahori, H.; Hagiwara, K.; Aoki, M.; Akiyama, T.; Taniguchi, S.; Okada, T.; Shirakawa, M.; Sakata, Y. "Linkage and Solvent Dependence of Photoinduced Electron Transfer in Zincporphyrin-C60 Dyads" J. Am. Chem. Soc. 1996, 118, 11771.
(31) Hiroshi, I.; Kiyoshi, H.; Tsuyoshi, A.; Masanori, A.; Seiji, T.; Tadashi, O.; Masahiro, S.; Yoshiteru, S. "The small reorganization energy of C60 in electron transfer" Chem. Phys. Lett. 1996, 263, 545.
(32) D'Souza, F.; Deviprasad, G. R.; El-Khouly, M. E.; Fujitsuka, M.; Ito, O. "Probing the Donor—Acceptor Proximity on the Physicochemical Properties of Porphyrin—Fullerene Dyads: "Tail-On" and "Tail-Off" Binding Approach" J. Am. Chem. Soc. 2001, 123, 5277.

(33) Guldi, D. M.; Luo, C.; Prato, M.; Troisi, A.; Zerbetto, F.; Scheloske, M.; Dietel, E.; Bauer, W.; Hirsch, A. "Parallel (Face-to-Face) Versus Perpendicular (Edge-to-Face) Alignment of Electron Donors and Acceptors in Fullerene Porphyrin Dyads: The Importance of Orientation in Electron Transfer" J. Am. Chem. Soc. 2001, 123, 9166.

(34) Guldi, D. M.; Hirsch, A.; Scheloske, M.; Dietel, E.; Troisi, A.; Zerbetto, F.; Prato, M. "Modulating Charge-Transfer Interactions in Topologically Different Porphyrin—C60 Dyads" Chemistry—A European Journal 2003, 9, 4968.

(35) Kesti, T.; Tkachenko, N.; Yamada, H.; Imahori, H.; Fukuzumi, S.; Lemmetyinen, H. "C70 vs. C60 in zinc porphyrin-fullerene dyads: prolonged charge separation and ultrafast energy transfer from the second excited singlet state of porphyrin" Photochem. Photobiol. Sci. 2003, 2, 251.

(36) Liddell, P. A.; Kodis, G.; Andréasson, J.; de la Garza, L.; Bandyopadhyay, S.; Mitchell, R. H.; Moore, T. A.; Moore, A. L.; Gust, D. "Photonic Switching of Photoinduced Electron Transfer in a Dihydropyrene—Porphyrin—Fullerene Molecular Triad" J. Am. Chem. Soc. 2004, 126, 4803.

(37) Schuster, D. I.; Li, K.; Guldi, D. M.; Palkar, A.; Echegoyen, L.; Stanisky, C.; Cross, R. J.; Niemi, M.; Tkachenko, N. V.; Lemmetyinen, H. "Azobenzene-Linked Porphyrin—Fullerene Dyads" J. Am. Chem. Soc. 2007, 129, 15973.

(38) Bourgeois, J.-P.; Diederich, F.; Echegoyen, L.; Nierengarten, J.-F. "Synthesis, and Optical and Electrochemical Properties of Cyclophane-Type Molecular Dyads Containing a Porphyrin in Close, Tangential Orientation Relative to the Surface of trans-1 Functionalized C60. Preliminary Communication" Hely. Chim. Acta 1998, 81, 1835.

(39) Fazio, M. A.; Durandin, A.; Tkachenko, N. V.; Niemi, M.; Lemmetyinen, H.; Schuster, D. I. "Synthesis, Conformational Interconversion, and Photophysics of Tethered Porphyrin—Fullerene Dyads with Parachute Topology" Chemistry—A European Journal 2009, 15, 7698.

(40) Guldi, D. M.; Zilbermann, I.; Gouloumis, A.; Vazquez, P.; Tones, T. "Metallophthalocyanines—Versatile Electron-Donating Building Blocks for Fullerene Dyads" The Journal of Physical Chemistry B 2004, 108, 18485.

(41) de la Escosura, A.; Martinez-Diaz, M. V.; Guldi, D. M.; Torres, T. "Stabilization of Charge-Separated States in Phthalocyanine—Fullerene Ensembles through Supramolecular Donor—Acceptor Interactions" J. Am. Chem. Soc. 2006, 128, 4112.

(42) Gonzalez-Rodriguez, D.; Torres, T.; Herranz, M. A.; Echegoyen, L.; Carbonell, E.; Guldi, D. M. "Screening Electronic Communication through ortho-, meta- and para-Substituted Linkers Separating Subphthalocyanines and C60" Chemistry—A European Journal 2008, 14, 7670.

(43) Sandanayaka, A. S. D.; Sasabe, H.; Araki, Y.; Furusho, Y.; Ito, 0.; Takata, T. "Photoinduced Electron-Transfer Processes between [C60]Fullerene and Triphenylamine Moieties Tethered by Rotaxane Structures. Through-Space Electron Transfer via Excited Triplet States of [60]Fullerene" The Journal of Physical Chemistry A 2004, 108, 5145.

(44) Sandanayaka, A. S. D.; Ikeshita, K.-i.; Rajkumar, G. A.; Furusho, Y.; Araki, Y.; Takata, T.; Ito, O. "Photoinduced Intramolecular Electron-Transfer Processes in [60]Fullerene and N,N-Bis(biphenyl)aniline Molecular Systems in Solutions" The Journal of Physical Chemistry A 2005, 109, 8088.

(45) Araki, Y.; Ito, O. "Factors controlling lifetimes of photoinduced charge-separated states of fullerene-donor molecular systems" Journal of Photochemistry and Photobiology C: Photochemistry Reviews 2008, 9, 93.

(46) Imahori, H.; Tamaki, K.; Guldi, D. M.; Luo, C.; Fujitsuka, M.; Ito, O.; Sakata, Y.; Fukuzumi, S. "Modulating Charge Separation and Charge Recombination Dynamics in Porphyrin—Fullerene Linked Dyads and Triads: Marcus-Normal versus Inverted Region" J. Am. Chem. Soc. 2001, 123, 2607.

(47) Curiel, D.; Ohkubo, K.; Reimers, J. R.; Fukuzumi, S.; Crossley, M. J. "Photoinduced electron transfer in a [small beta],[small beta][prime or minute]-pyrrolic fused ferrocene-(zinc porphyrin)-fullerene" Phys. Chem. Chem. Phys. 2007, 9, 5260.

(48) Araki, Y.; Chitta, R.; Sandanayaka, A. S. D.; Langenwalter, K.; Gadde, S.; Zandler, M. E.; Ito, O.; D'Souza, F. "Self-Assembled Supramolecular Ferrocene—Fullerene Dyads and Triad: Formation and Photoinduced Electron Transfer" The Journal of Physical Chemistry C 2008, 112, 2222.

(49) Seok, J. H.; Park, S. H.; El-Khouly, M. E.; Araki, Y.; Ito, 0.; Kay, K.-Y. "Photoinduced processes of newly synthesized bisferrocene- and bisfullerene-substituted tetrads with a triphenylamine central block" J. Organomet. Chem. 2009, 694, 1818.

(50) Poddutoori, P. K.; Sandanayaka, A. S. D.; Hasobe, T.; Ito, O.; van der Est, A. "Photoinduced Charge Separation in a Ferrocene—Aluminum(III) Porphyrin—Fullerene Supramolecular Triad†" The Journal of Physical Chemistry B 2010, 114, 14348.

(51) Gonzalez-Rodriguez, D.; Torres, T.; Olmstead, M. M.; Rivera, J.; Herranz, M. A.; Echegoyen, L.; Castellanos, C. A.; Guldi, D. M. "Photoinduced Charge-Transfer States in Subphthalocyanine—Ferrocene Dyads" J. Am. Chem. Soc. 2006, 128, 10680.

(52) Jousselme, B.; Blanchard, P.; Levillain, E.; de Bettignies, R.; Roncali, J. "Electrochemical Synthesis of C60-Derivatized Poly(thiophene)s from Tailored Precursors" Macromolecules 2003, 36, 3020.

(53) van Hal, P. A.; Meskers, S. C. J.; Janssen, R. A. J. "Photoinduced energy and electron transfer in oligo(<i>p</i>-phenylene vinylene)-fullerene dyads" Applied Physics A: Materials Science & Processing 2004, 79, 41.

(54) Handa, S.; Giacalone, F.; Haque, S. A.; Palomares, E.; Martin, N.; Durrant, J. R. "Solid Film versus Solution-Phase Charge-Recombination Dynamics of exTTF—Bridge—C60 Dyads" Chemistry—A European Journal 2005, 11, 7440.

(55) Ohkubo, K.; Ortiz, J.; Martin-Gomis, L.; Fernandez-Lazaro, F.; Sastre-Santos, A.; Fukuzumi, S. "Fullerene acting as an electron donor in a donor-acceptor dyad to attain the long-lived charge-separated state by complexation with scandium ion" Chemical Communications 2007, 589.

(56) Kawauchi, H.; Suzuki, S.; Kozaki, M.; Okada, K.; Islam, D. M. S.; Araki, Y.; Ito, O.; Yamanaka, K.-i. "Photoinduced Charge-Separation and Charge-Recombination Processes of Fullerene[60] Dyads Covalently Connected with Phenothiazine and Its Trimer" The Journal of Physical Chemistry A 2008, 112, 5878.

(57) Ventura, B.; Barbieri, A.; Zanelli, A.; Barigelletti, F.; Seneclauze, J. B.; Diring, S. p.; Ziessel, R. "Excited-State Dynamics in a Dyad Comprising Terpyridine-Platinum (II) Ethynylene Linked to Pyrrolidino-[60]Fullerene" Inorg. Chem. 2009, 48, 6409.

(58) Delgado, J. L.; Bouit, P.-A.; Filippone, S.; Herranz, M. A.; Martin, N. "Organic photovoltaics: a chemical approach" Chemical Communications 2010, 46, 4853.

(59) Pinzon, J. R.; Plonska-Brzezinska, M. E.; Cardona, C. M.; Athans, A. J.; Gayathri, S. S.; Guldi, D. M.; Herranz, M. A.; Martin, N.; Torres, T.; Echegoyen, L. "Sc3N@C80-Ferrocene Electron-Donor/Acceptor Conjugates as Promising Materials for Photovoltaic Applications" Angewandte Chemie International Edition 2008, 47, 4173.

(60) Pinzon, J. R.; Gasca, D. C.; Sankaranarayanan, S. G.; Bottari, G.; Torres, T.; Guldi, D. M.; Echegoyen, L. "Photoinduced Charge Transfer and Electrochemical Properties of Triphenylamine Ih-Sc3N@C80 Donor-Acceptor Conjugates" Journal of the American Chemical Society 2009, 131, 7727.

(61) Wolfrum, S.; Pinzon, J. R.; Molina-Ontoria, A.; Gouloumis, A.; Martin, N.; Echegoyen, L.; Guldi, D. M. "Utilization of Sc3N@C80 in long-range charge transfer reactions" Chemical Communications 2011, 47, 2270.

(62) Imahori, H.; Fukuzumi, S. "Porphyrin- and Fullerene-Based Molecular Photovoltaic Devices" Adv. Funct. Mater. 2004, 14, 525.

(63) Hau, S. K.; Yip, H.-L.; Ma, H.; Jen, A. K. Y. "High performance ambient processed inverted polymer solar cells through interfacial modification with a fullerene self-assembled monolayer" Appl. Phys. Lett. 2008, 93, 233304/1.

(64) Matsuo, Y.; Ichiki, T.; Nakamura, E. "Molecular Photoelectric Switch Using a Mixed SAM of Organic [60]Fullerene and [70]Fullerene Doped with a Single Iron Atom" Journal of the American Chemical Society 2011, null.

(65) Cho, Y.-J.; Ahn, T. K.; Song, H.; Kim, K. S.; Lee, C. Y.; Seo, W. S.; Lee, K.; Kim, S. K.; Kim, D.; Park, J. T. "Unusually High Performance Photovoltaic Cell Based on a [60]Fullerene Metal Cluster—Porphyrin Dyad SAM on an ITO Electrode" Journal of the American Chemical Society 2005, 127, 2380.

(66) Ka, J.-W.; Lee, C.-H. "Optimizing the synthesis of 5,10-disubstituted tripyrromethanes" Tetrahedron Lett. 2000, 41, 4609.

(67) Maggini, M.; Scorrano, G.; Prato, M. "Addition of azomethine ylides to C60: synthesis, characterization, and functionalization of fullerene pyrrolidines" J. Am. Chem. Soc. 1993, 115, 9798.

(68) Saam, J. C.; Speier, J. L. "The Addition of Silicon Hydrides to Olefinic Double Bonds. Part III. The Addition to Non-terminal Olefins in the Presence of Chloroplatinic Acid" J. Am. Chem. Soc. 1958, 80, 4104.

(69) Johnstone, R. A. W.; Rose, M. E. "A rapid, simple, and mild procedure for alkylation of phenols, alcohols, amides and acids" Tetrahedron 1979, 35, 2169.

(70) Burk, R. M.; Gac, T. S.; Roof, M. B. "A mild procedure for etherification of alcohols with primary alkyl halides in the presence of silver triflate" Tetrahedron Lett. 1994, 35, 8111.

(71) Terao, J.; Kambe, N. "Transition metal catalyzed carbon-silicon bond forming reactions using chlorosilanes promoted by Grignard reagents" The Chemical Record 2007, 7, 57.

(72) Campidelli, S.; Vazquez, E.; Milic, D.; Prato, M.; Barbera, J.; Guldi, D. M.; Marcaccio, M.; Paolucci, D.; Paolucci, F.; Deschenaux, R. "Liquid-crystalline fullerene-ferrocene dyads" J. Mater. Chem. 2004, 14, 1266.

(73) Guldi, D. M.; Luo, C.; Kotov, N. A.; Ros, T. D.; Bosi, S.; Prato, M. "Zwitterionic Acceptor Moieties: Small Reorganization Energy and Unique Stabilization of Charge Transfer Products†" The Journal of Physical Chemistry B 2003, 107, 7293.

(74) Haque, A.-M. J.; Kim, K. "Aldehyde-Functionalized Benzenediazonium Cation for Multiprobe Immobilization on Microelectrode Array Surfaces" Langmuir 2011, 27, 882.

(75) Hoang, V. T.; Rogers, L. M.; D'Souza, F. "Synthesis and formation of monolayer self-assembly of thiol appended fullerenes and fullerene-ferrocene dyads on gold electrode" Electrochem. Commun. 2002, 4, 50.

(76) Wolfrum, S.; Pinzon, J. R.; Molina-Ontoria, A.; Gouloumis, A.; Martin, N.; Echegoyen, L.; Guldi, D. M. "Utilization of Sc3N@C80 in long-range charge transfer reactions" Chemical Communications (Cambridge, United Kingdom) 2011, 47, 2270.

(77) Li, J.; Wang, L.; Liu, J.; Evmenenko, G.; Dutta, P.; Marks, T. J. "Characterization of Transparent Conducting Oxide Surfaces Using Self-Assembled Electroactive Monolayers" Langmuir 2008, 24, 5755.

(78) Zhang, S.; Cardona, C. M.; Echegoyen, L. "Ion recognition properties of self-assembled monolayers (SAMs)" Chemical Communications 2006, 4461.

(79) Zhang, S.; Song, F.; Echegoyen, L. "Synthesis, Self-Assembled Monolayers and Alkaline Earth Metal Ion Recognition of p-tert-Butylcalix[4]arene Derivatives" Eur. J. Org. Chem. 2004, 2004, 2936.

(80) Fragoso, A.; Almirall, E.; Cao, R.; Echegoyen, L.; Gonzalez-Jonte, R. "A supramolecular approach to the selective detection of dopamine in the presence of ascorbate" Chemical Communications 2004, 2230.

(81) Rommel, M.; Yanev, V.; Paskaleva, A.; Erlbacher, T.; Lemberger, M.; Bauer, A. J.; Frey, L. "Electrical scanning probe microscopy techniques for the detailed characterization of high-k dielectric layers" ECS Trans. 2010, 28, 139.

(82) Pingree, L. S. C.; Reid, O. G.; Ginger, D. S. "Electrical scanning probe microscopy on active organic electronic devices" Adv. Mater. (Weinheim, Ger.) 2009, 21, 19.

(83) Zhang, S.; Echegoyen, L. "Self-assembled monolayers of different conformers of p-tert-butylcalix[4]crown-6 derivatives and their metal cation recognition properties" Tetrahedron Lett. 2003, 44, 9079.

(84) Bandyopadhyay, K.; Liu, H.; Liu, S.-G.; Echegoyen, L. "Self-assembled monolayers of bis-thioctic ester derivatives of oligoethyleneglycols: remarkable selectivity for K/Na recognition" Chemical Communications 2000, 141.

(85) Bandyopadhyay, K.; Liu, S.-G.; Liu, H.; Echegoyen, L. "Ion Recognition at the Interface of Self-Assembled Monolayers (SAMs) of Bis-Thioctic Ester Derivatives of Oligo(ethyleneglycols)" Chemistry—A European Journal 2000, 6, 4385.

(86) Bandyopadhyay, K.; Shu, L.; Liu, H.; Echegoyen, L. "Selective K+ Recognition at the Interface during Self-Assembly of a Bis-Podand Thiol on a Gold Surface" Langmuir 2000, 16, 2706.

(87) Liu, S.-G.; Liu, H.; Bandyopadhyay, K.; Gao, Z.; Echegoyen, L. "Dithia-Crown-Annelated Tetrathiafulvalene Disulfides: Synthesis, Electrochemistry, Self-Assembled Films, and Metal Ion Recognition" The Journal of Organic Chemistry 2000, 65, 3292.

(88) Zhang, S.; Echegoyen, L. "Selective Anion Sensing by a Tris-Amide CTV Derivative: 1H NMR Titration, Self-Assembled Monolayers, and Impedance Spectroscopy" J. Am. Chem. Soc. 2005, 127, 2006.

(89) Reid, O. G.; Rayermann, G. E.; Coffey, D. C.; Ginger, D. S. "Imaging Local Trap Formation in Conjugated Polymer Solar Cells: A Comparison of Time-Resolved Electrostatic Force Microscopy and Scanning Kelvin Probe Imaging" J. Phys. Chem. C 2010, 114, 20672.

(90) Nonnenmacher, M.; O'Boyle, M. P.; Wickramasinghe, H. K. "Kelvin probe force microscopy" Appl. Phys. Lett. 1991, 58, 2921.

(91) Hains, A. W.; Martinson, A. B. F.; Irwin, M. D.; Yan, H.; Marks, T. J. "Bulk-heterojunction organic solar cells: interfacial engineering routes to increased open-circuit voltage and power conversion efficiency" PMSE Preprints 2007, 96, 814.

(92) Leever, B. J.; Durstock, M. F.; Irwin, M. D.; Hains, A. W.; Marks, T. J.; Pingree, L. S. C.; Hersam, M. C. "Spatially resolved photocurrent mapping of operating organic photovoltaic devices using atomic force photovoltaic microscopy" Appl. Phys. Lett. 2008, 92, 013302/1.

(93) Silvestri, F.; Irwin, M. D.; Beverina, L.; Facchetti, A.; Pagani, G. A.; Marks, T. J. "Efficient Squaraine-Based Solution Processable Bulk-Heterojunction Solar Cells" Journal of the American Chemical Society 2008, 130, 17640.

(94) Liang, Y.; Yu, L. "A New Class of Semiconducting Polymers for Bulk Heterojunction Solar Cells with Exceptionally High Performance" Acc. Chem. Res. 2010, 43, 1227.

(95) Kim, J. Y.; Lee, K.; Coates, N. E.; Moses, D.; Nguyen, T.-Q.; Dante, M.; Heeger, A. J. "Efficient Tandem Polymer Solar Cells Fabricated by All-Solution Processing" Science (Washington, D.C., U. S.) 2007, 317, 222.

(96) Hummelen, J. C.; Knight, B. W.; LePeq, F.; Wudl, F.; Yao, J.; Wilkins, C. L. "Preparation and Characterization of Fulleroid and Methanofullerene Derivatives" J. Org. Chem. 1995, 60, 532.

(97) Waldauf, C.; Morana, M.; Denk, P.; Schilinsky, P.; Coakley, K.; Choulis, S. A.; Brabec, C. J. "Highly efficient inverted organic photovoltaics using solution based titanium oxide as electron selective contact" Appl. Phys. Lett. 2006, 89, 233517.

(98) O'Regan, B.; Gratzel, M. "A low-cost, high-efficiency solar cell based on dye-sensitized colloidal TiO2 films" Nature 1991, 353, 737.

(99) Kramer, P.; Sharma, A. K.; Hennecke, E. E.; Yasuda, H. "Polymerization of para-xylylene derivatives (parylene polymerization). I. Deposition kinetics for parylene N and parylene C" Journal of Polymer Science: Polymer Chemistry Edition 1984, 22, 475.

What is claimed is:

1. An organic photovoltaic device (OPV) comprising: an anode comprising a first electrically conductive electrode; a cathode comprising a second electrically conductive electrode; a bulk heterojunction (BHJ) photoactive layer (PAL); and an interfacial layer (IFL) sandwiched between the anode and/or the cathode and the BHJ PAL, wherein the IFL comprises a monolayer comprising a x-D-y-A or D-y-A-x photoactive dyad comprising: an electron acceptor (A) covalently linked either directly or through one or more linkers (y) to an electron donor (D), wherein one of the electron donor (D) and the electron acceptor (A) is anchored to the first or second electrode surface by one or more anchoring groups (x); and the other of the electron acceptor (A) and the electron donor (D) is attached to or in communication with the BJH PAL.

2. The OPV device of claim 1, wherein the first, second or both electrically conductive electrodes comprise metals; oxides; sulfides; tellurides; nitrides; phosphides; selenides; graphene; cadmium oxide; titanium oxide; nickel oxide; tungsten oxide; vanadium oxide; molybdenum oxide; indium tin oxide (ITO); Al:ZnO (AZO); F:SnO$_2$ (FTO); gold; silver; aluminum; magnesium; calcium; platinum coated ITO glass; or combinations or modifications thereof.

3. The OPV device of claim 1, wherein the first, second or both electrodes may comprise an electrically conductive layer selected from one or more conductive elements comprising carbon; graphite; soot; carbon allotropes; or any combinations or modifications thereof.

4. The OPV device of claim 1, wherein the electron donor (D) is selected from the group consisting of porphyrins (Por); pthalocyanines (Pcs); triphenylamines (TPAs); ferrocenes (Fc); dihydropyrene; or any combinations and modifications thereof; such as; fused electron donors (D-D) including porphyrins-triphenylamines (Por-TPAs); porphyrins-ferrocenes (Por-Fc); porphyrins-pyrenes; pthalocyanines-triphenylamines (Pcs-TPAs); phtalocyanines-ferrocenes (Pcs-Fc); or any combinations and modifications thereof and, wherein the electron acceptor is selected from the group consisting of fullerenes ($C_{2n}$, n≥29); endohedral metallofullerenes ($M_x@C_{2n}$; M=Ce, Dy, Er, Gd, Ho, Lu, Sc, Y; x=1,2,3,4; n≥29); multimetallic endohedral fullerenes ($M_xE_y@C_{2n}$; M=Ce, Dy, Er, Ho, Lu, Sc, Y; E=N, O, S; x=2,3,4; y=1,2,3; n≥29); or any combinations and modifications thereof.

5. The OPV device of claim 1, wherein the anchoring groups (x) are selected from the group consisting of any silane (—SIR$_3$, —SiR$_2$X, —SiRX$_2$, —SiX$_3$, —Si(OR)$_3$, where X=any halide, R=any carbon substituent) groups; carboxylate or carboxylic acid groups; diazonium groups; oxygen-; phosphorous-; sulfur-; or nitrogen-containing groups; or any combinations and modifications thereof and wherein the one or more linkers are selected from the group consisting of p-cyclophane units; phenylene groups; alkyl groups; silane groups; phosphine or phosphate groups; sulfide; sulfite; or sulfate groups; oxide groups; or any combinations and modifications thereof.

6. The OPV device of claim 1, wherein the monolayer a self-assembled monolayer (SAM).

7. The OPV device of claim 1, wherein the dyads are photo-switchable.

8. The OPV device of claim 1, wherein each dyad is polar in a ground state and zwitterionic in an excited state.

* * * * *